United States Patent [19]
Eller

[11] Patent Number: 5,737,733
[45] Date of Patent: Apr. 7, 1998

[54] METHOD AND SYSTEM FOR SEARCHING COMPRESSED DATA

[75] Inventor: Marlin Jay Eller, Seattle, Wash.

[73] Assignee: Microsoft Corporation, Redmond, Wash.

[21] Appl. No.: 721,558

[22] Filed: Sep. 26, 1996

Related U.S. Application Data

[63] Continuation of Ser. No. 85,481, Jun. 30, 1993, abandoned.
[51] Int. Cl.$^6$ ................................................. G06F 17/30
[52] U.S. Cl. .................................................. 727/3; 707/101
[58] Field of Search ................... 364/DIG. 1, DIG. 2, 364/715.02, 715.03; 395/600, 603, 606, 612; 341/50, 55, 67, 90, 106

[56] References Cited

U.S. PATENT DOCUMENTS

| | | | |
|---|---|---|---|
| 3,593,309 | 7/1971 | Clark, IV et al. | 340/172.5 |
| 3,643,226 | 2/1972 | Loizides et al. | 340/172.5 |
| 3,651,483 | 3/1972 | Clark, IV et al. | 340/172.5 |
| 4,617,663 | 10/1986 | Lake et al. | 371/25 |
| 4,650,927 | 3/1987 | James | 379/96 |
| 4,701,851 | 10/1987 | Bass et al. | 364/419 |
| 5,163,094 | 11/1992 | Prokoski et al. | 382/2 |
| 5,191,635 | 3/1993 | Fujimoto | 395/2 |
| 5,253,341 | 10/1993 | Rozmanith et al. | 395/200 |
| 5,274,805 | 12/1993 | Ferguson et al. | 395/600 |
| 5,276,868 | 1/1994 | Poole | 395/600 |
| 5,325,091 | 6/1994 | Kaplan et al. | 341/51 |
| 5,333,313 | 7/1994 | Heising | 395/600 |
| 5,337,233 | 8/1994 | Hofert et al. | 364/419.14 |
| 5,347,632 | 9/1994 | Filepp et al. | 395/200 |
| 5,414,838 | 5/1995 | Kolton et al. | 395/600 |

OTHER PUBLICATIONS

Bell, Timothy C. et al., *Text Compression*, Prentice Hall, Inc., Englewood Cliffs, New Jersey 07632, 1990, Chap. 1, "Why Compress Text?" pp. 1–27.

Williams, Ross H., *Adaptive Data Compression*, Kluwer Academic Pub., 1991, Chap. 1, "Introductory Survey," pp. 33–41.

*Primary Examiner*—Thomas G. Black
*Assistant Examiner*—Maria N. Von Buhr
*Attorney, Agent, or Firm*—Seed and Berry LLP

[57] ABSTRACT

A method and system for searching a compressed document while a plurality of character strings stored in the compressed document are stored in a compressed code. A query request is received, the query request is converted into the compressed code, and the converted query request is compared with the compressed codes stored in the compressed document. The initiator of the query request is then informed about the results of the comparison.

25 Claims, 37 Drawing Sheets

DICTIONARY 125

| COMPRESSED CODE | UNCOMPRESSED DATA | |
|---|---|---|
| 0000 0000 0000 0000 | AS | |
| 0000 0000 0000 0001 | DOCUMENT | |
| 0000 0000 0000 0010 | IS | |
| 0000 0000 0000 0011 | IT | WORDS SECTION 131 |
| 0000 0000 0000 0100 | NOT | |
| 0000 0000 0000 0101 | THE | |
| | | |
| 0111 0101 0010 1111 | ALLCAPS | |
| 0111 0101 0011 0000 | CARRIAGE RETURN | |
| 0111 0101 0011 0001 | CARRIAGE RETURN-LINE FEED | |
| 0111 0101 0011 0010 | CARRIAGE RETURN-LINE FEED-TAB-TAB | |
| 0111 0101 0011 0011 | FIRST CAP | |
| 0111 0101 0011 0100 | NIL STRING-FIRST CAP | |
| 0111 0101 0011 0101 | PERIOD SPACE | |
| 0110 0101 0011 0110 | PERIOD-SPACE-SPACE | PUNCTUATION AND |
| 0111 0101 0011 0111 | PERIOD-FIRST CAP | FORMATTING |
| 0111 0101 0011 1000 | QUESTION MARK | SECTION 137 |
| 0111 0101 0011 1001 | RUN ON | |
| 0111 0101 0011 1010 | PERIOD SPACE-SPACE FIRST CAP | |
| | | |
| 0111 0101 0011 1011 | AA | |
| *** | *** | PAIRS SECTION 133 |
| 0111 0101 0011 1110 | AD | |
| *** | *** | |
| 0111 0110 1101 0110 | RE | |
| *** | *** | |
| 0111 0111 0111 1010 | ZZ | |
| | | |
| 0111 0111 0111 1011 | 00 | |
| *** | *** | PAIRS SECTION 133 |
| 0111 0111 1101 1110 | 99 | |
| | | |
| 0111 0111 1101 1111 | A | |
| *** | *** | ASCII SECTION 135 |
| 1111 1111 1111 0100 | Y | |
| 1111 1111 1111 0101 | Z | |
| 1111 1111 1111 0110 | 0 | |
| 1111 1111 1111 0111 | 1 | |
| 1111 1111 1111 1000 | 2 | |
| 1111 1111 1111 1001 | 3 | |
| 1111 1111 1111 1001 | 4 | |
| 1111 1111 1111 1010 | 5 | |
| 1111 1111 1111 1100 | 6 | |
| 1111 1111 1111 1101 | 7 | |
| 1111 1111 1111 1110 | 8 | |
| 1111 1111 1111 1111 | 9 | |

*Fig. 2A*

DICTIONARY 145

| COMPRESSED CODE | UNCOMPRESSED DATA | |
|---|---|---|
| 0000 0000 0000 0000 | AS | |
| 0000 0000 0000 0001 | DOCUMENT | |
| 0000 0000 0000 0010 | IS | |
| 0000 0000 0000 0011 | IT | WORDS SECTION 151 |
| 0000 0000 0000 0100 | NOT | |
| 0000 0000 0000 0101 | THE | |
| | | |
| 0111 0101 0010 1111 | ALLCAPS | |
| 0111 0101 0011 0000 | CARRIAGE RETURN | |
| 0111 0101 0011 0001 | CARRIAGE RETURN-LINE FEED | |
| 0111 0101 0011 0010 | CARRIAGE RETURN-LINE FEED-TAB-TAB | |
| 0111 0101 0011 0011 | FIRST CAP | |
| 0111 0101 0011 0100 | NIL STRING-FIRST CAP | |
| 0111 0101 0011 0101 | PERIOD SPACE | |
| 0110 0101 0011 0110 | PERIOD-SPACE-SPACE | PUNCTUATION AND |
| 0111 0101 0011 0111 | PERIOD-FIRST CAP | FORMATTING |
| 0111 0101 0011 1000 | QUESTION MARK | SECTION 157 |
| 0111 0101 0011 1001 | RUN ON | |
| 0111 0101 0011 1010 | PERIOD SPACE-SPACE FIRST CAP | |
| | | |
| 0111 0101 0011 1011 | AA | |
| *** | *** | PAIRS SECTION 153 |
| 0111 0101 0011 1110 | AD | |
| *** | *** | |
| 0111 0110 1101 0110 | RE | |
| *** | *** | |
| 0111 0111 0111 1010 | ZZ | |
| | | |
| 0111 0111 0111 1011 | 00 | |
| *** | *** | |
| 0111 0111 1101 1110 | 99 | |
| | | |
| 0111 0111 1101 1111 | A | |
| *** | *** | ASCII SECTION 155 |
| 1111 1111 1111 0100 | Y | |
| 1111 1111 1111 0101 | Z | |
| 1111 1111 1111 0110 | 0 | |
| 1111 1111 1111 0111 | 1 | |
| 1111 1111 1111 1000 | 2 | |
| 1111 1111 1111 1001 | 3 | |
| 1111 1111 1111 1001 | 4 | |
| 1111 1111 1111 1010 | 5 | |
| 1111 1111 1111 1100 | 6 | |
| 1111 1111 1111 1101 | 7 | |
| 1111 1111 1111 1110 | 8 | |
| 1111 1111 1111 1111 | 9 | |

*Fig. 2B*

UNCOMPRESSED DOCUMENT 101

| T | h | e | SPACE |
|---|---|---|---|
| 00000001 | 00000010 | 00000011 | 00000100 |

| d | o | c | u |
|---|---|---|---|
| 00000101 | 00000110 | 00000111 | 00001000 |

| m | e | n | t |
|---|---|---|---|
| 00001001 | 00000011 | 00001010 | 00001011 |

| SPACE | i | s | SPACE |
|---|---|---|---|
| 00000100 | 00001100 | 00001101 | 00000100 |

| r | e | a | d |
|---|---|---|---|
| 00001110 | 00000011 | 00001111 | 00000101 |

| y | PERIOD | SPACE | I |
|---|---|---|---|
| 00010000 | 00010001 | 00000100 | 00001100 |

| s | SPACE | i | t |
|---|---|---|---|
| 00001101 | 00000100 | 00001100 | 00001011 |

| SPACE | n | o | t |
|---|---|---|---|
| 00000100 | 00001010 | 00000110 | 00001011 |

| ? |
|---|
| 00010000 |

*Fig. 18

COMPRESSED DOCUMENT — 149

| FirstCap | the | document |
|---|---|---|
| 0111 0101 0011 0011 | 0000 0000 0000 0101 | 0000 0000 0000 0001 |

| is | re | ad |
|---|---|---|
| 0000 0000 0000 0010 | 0111 0110 1101 0110 | 0111 0101 0011 1110 |

| y | Period-Space-Space-FirstCap | is |
|---|---|---|
| 1111 1111 1111 0100 | 0111 0101 0011 1010 | 0000 0000 0000 0010 |

| it | not | Question Mark |
|---|---|---|
| 0000 0000 0000 0011 | 0000 0000 0000 0100 | 0111 0101 0011 1000 |

*Fig. 19*

DICTIONARY 125'

| COMPRESSED CODE | UNCOMPRESSED DATA | |
|---|---|---|
| 00011 | AS | |
| 0011001 | DOCUMENT | |
| 001001 | IS | |
| 01000001 | IT | WORDS SECTION 131' |
| 0011010 | NOT | |
| 0011011 | THE | |

| | | |
|---|---|---|
| 0110000001 | ALLCAPS | |
| 10100000000001 | CARRIAGE RETURN | |
| 1100000000000001 | CARRIAGE RETURN-LINE FEED | |
| 01000010 | CARRIAGE RETURN-LINE FEED-TAB-TAB | |
| 111000000000000001 | FIRST CAP | |
| 1111000000000000001 | NIL STRING-FIRST CAP | |
| 1001000000001 | PERIOD SPACE | |
| 100000000001 | PERIOD-SPACE-SPACE | PUNCTUATION AND |
| 101100000000001 | PERIOD-FIRST CAP | FORMATTING |
| 1100000000000010 | QUESTION MARK | SECTION 137' |
| 1100000000000011 | RUN ON | |
| 1111000000000000010 | PERIOD SPACE-SPACE FIRST CAP | |

| | | |
|---|---|---|
| 1111000000000000011 | AA | |
| *** | *** | PAIRS SECTION 133' |
| 1010000000010 | AD | |
| *** | *** | |
| 0110000010 | RE | |
| *** | *** | |
| 01110000001 | ZZ | |

| | | |
|---|---|---|
| 011100000010 | 00 | |
| *** | *** | PAIRS SECTION 133' |
| 101100000000010 | 99 | |

| | | |
|---|---|---|
| 110000000000010 | A | |
| *** | *** | ASCII SECTION 135' |
| 111100000000000100 | Y | |
| 1100000000000010 | Z | |
| 1101000000000001 | 0 | |
| 111110000000000101 | 1 | |
| 100000000010 | 2 | |
| 1101000000000010 | 3 | |
| 1101000000000011 | 4 | |
| 1001000000010 | 5 | |
| 100000000011 | 6 | |
| 110000000000010 | 7 | |
| 110000000000110 | 8 | |
| 110000000000111 | 9 | |

*Fig. 27A*

DICTIONARY 145'

| COMPRESSED CODE | UNCOMPRESSED DATA | |
|---|---|---|
| 00011 | AS | |
| 0011001 | DOCUMENT | |
| 001001 | IS | |
| 01000001 | IT | WORDS SECTION 151' |
| 0011010 | NOT | |
| 0011011 | THE | |
| | | |
| 0110000001 | ALLCAPS | |
| 10100000000001 | CARRIAGE RETURN | |
| 1100000000000001 | CARRIAGE RETURN-LINE FEED | |
| 01000010 | CARRIAGE RETURN-LINE FEED-TAB-TAB | |
| 111000000000000001 | FIRST CAP | |
| 111100000000000001 | NIL STRING-FIRST CAP | |
| 1001000000001 | PERIOD SPACE | |
| 100000000001 | PERIOD-SPACE-SPACE | PUNCTUATION AND |
| 101100000000001 | PERIOD-FIRST CAP | FORMATTING |
| 110000000000010 | QUESTION MARK | SECTION 157' |
| 110000000000011 | RUN ON | |
| 111100000000000010 | PERIOD SPACE-SPACE FIRST CAP | |
| | | |
| 111100000000000011 | AA | |
| *** | *** | PAIRS SECTION 153' |
| 1010000000010 | AD | |
| *** | *** | |
| 0110000010 | RE | |
| *** | *** | |
| 01110000001 | ZZ | |
| | | |
| 011100000010 | 00 | |
| *** | *** | |
| 101100000000010 | 99 | |
| | | |
| 110000000000010 | A | |
| *** | *** | ASCII SECTION 155' |
| 111100000000000100 | Y | |
| 111000000000010 | Z | |
| 110100000000001 | 0 | |
| 111100000000000101 | 1 | |
| 100000000010 | 2 | |
| 110100000000010 | 3 | |
| 110100000000011 | 4 | |
| 1001000000010 | 5 | |
| 100000000011 | 6 | |
| 110000000000010 | 7 | |
| 110000000000110 | 8 | |
| 110000000000111 | 9 | |

*Fig. 27B*

METHOD AND SYSTEM FOR SEARCHING COMPRESSED DATA

CROSS-REFERENCE TO RELATED APPLICATION

This application is a file wrapper continuation of U.S. patent application Ser. No. 08/085,481, filed Jun. 30, 1993, now abandoned.

TECHNICAL FIELD

This invention relates generally to a computer method and system for searching data in a computer.

BACKGROUND OF THE INVENTION

The electronic collection and storage of information presents problems in many environments. For example, when data is downloaded from an information service to a remote computer, vast amounts of data are transferred in a short interval. The remote computer typically stores this data in a computer memory for later processing. To reduce the amount of data transferred by the information service, the amount of data stored by the remote computer, and the time required for transmission of the data, the information service typically compresses the data before transmitting the data to the remote computer.

Compression methods generally fall into two categories: fixed length compression methods and variable length compression methods. Fixed length compression methods represent each symbol by the same number of bits. For example, the LZ 78 type of Ziv-Lempel coding is a fixed length compression method. Variable length compression methods represent each symbol by a varying number of bits. Variable length compression methods typically assign shorter codes to more frequently used symbols. For example, the well-known Morse code is a variable length compression method.

Existing systems convert the compressed code representing the data back into its uncompressed form and then process the uncompressed data if it is desired to search through the data. This requires a time consuming decompression step.

It would be desirable to have a search method which allows for the more efficient searching of data that has been compressed.

SUMMARY OF THE INVENTION

The present invention provides a method and system for searching a compressed document while a plurality of character strings stored in the compressed document are stored in a compressed code. The present invention receives a query request, converts the query request into the compressed code of the present invention, and compares the converted query request with the compressed codes stored in the compressed document. The present invention then informs the initiator of the query request about the results of the comparison.

BRIEF DESCRIPTION OF THE DRAWINGS

FIG. 2A is a block diagram of a dictionary with fixed length compressed codes for a host computer of the system of FIG. 1.

FIG. 2B is a block diagram of a dictionary with fixed length compressed codes for a remote computer of the system of FIG. 1.

FIG. 18 is a block diagram of the uncompressed codes of the sample document.

FIG. 19 is a block diagram of fixed length compressed codes of the sample document.

FIG. 27A is a block diagram of a dictionary with variable length compressed codes for a host computer of the system of FIG. 1.

FIG. 27B is a block diagram of a dictionary with variable length compressed codes for a remote computer of the system of FIG. 1.

DETAILED DESCRIPTION OF THE INVENTION

Figure 1:
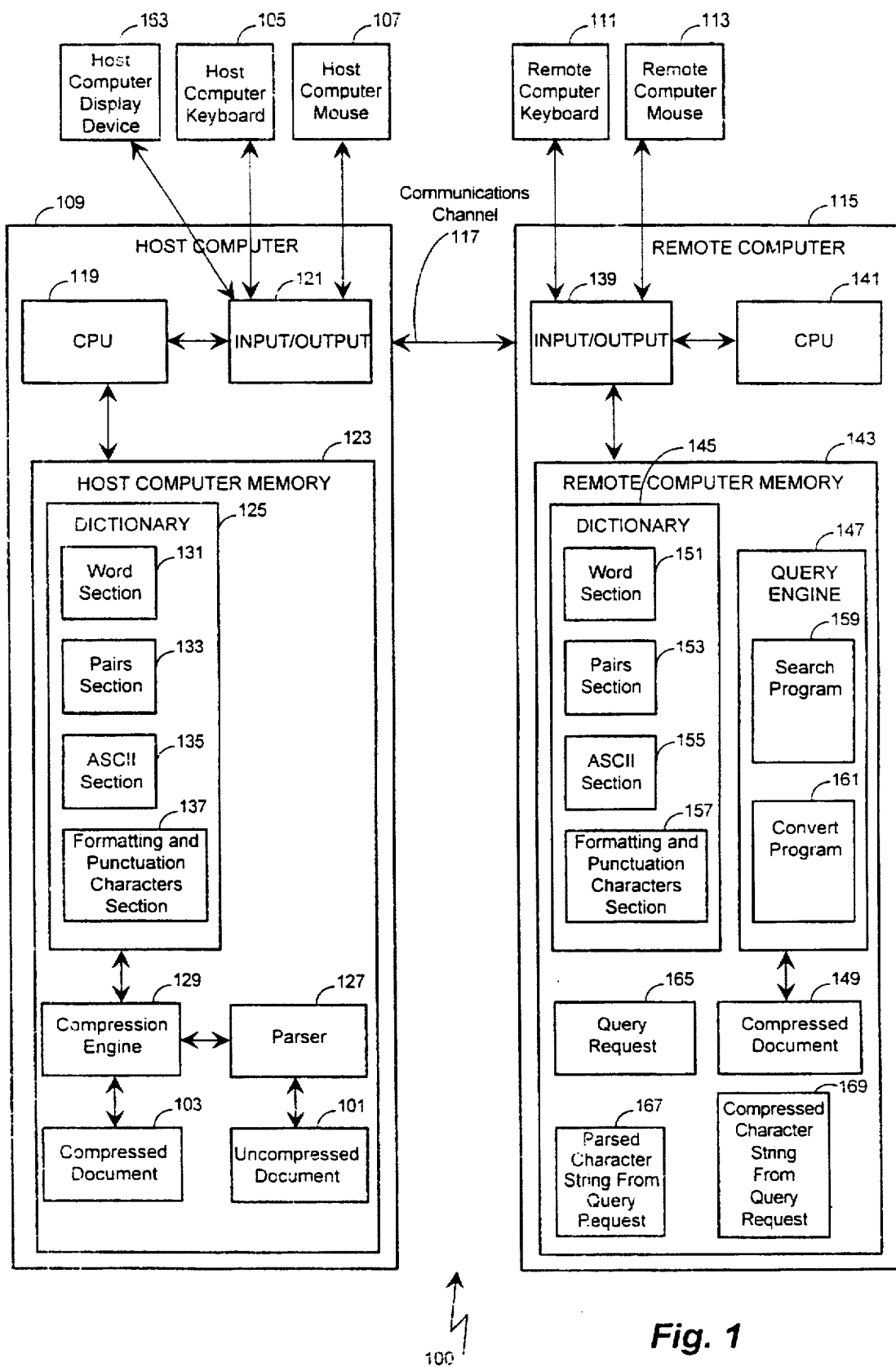
FIG. 1 is a block diagram of a system embodying the present invention for searching for character strings in a compressed document while the character strings are stored in a compressed code.

As shown in FIG. 1, the present invention is embodied in a computer system 100 and a method executed in the computer system which converts character strings in an uncompressed document 101 from an uncompressed code to a compressed code, stores the character strings in their compressed code in a compressed document 103 in response to a user request, and searches for character strings in the compressed document 103 while the character strings remain stored in their compressed code.

The System

The computer system 100 comprises a host computer keyboard 105, a host computer mouse 107, a host computer 109, a remote computer keyboard 111, a remote computer mouse 113, a remote computer 115, and a communications channel 117 to transmit data between the host computer 109 and the remote computer 115. In the host computer 109, documents can be stored in their uncompressed form and then when requested by the remote computer 115, the documents can be compressed and transmitted via the communications channel 117 to the remote computer 115. At the remote computer 115 the documents need not be uncompressed before a query can be processed against the documents.

The host computer 109 further includes a central processing unit 119, an input/output unit 121, and a host computer memory 123. In addition, the host computer memory 123 stores a dictionary 125, the uncompressed document 101, a parser 127, when executing on the central processing unit 119, a compression engine 129, and the compressed document 103. The parser 127 retrieves character strings from the uncompressed document 101. The retrieved character strings from the uncompressed document 101 are in the uncompressed code. A typical uncompressed code is the ASCII code which represents each character as an 8 bit string of zeros and ones. The compression engine 129, when executing on the central processing unit 119, converts the uncompressed character string to a compressed character string using the dictionary 125. In one embodiment the compressed character string is represented as a 16-bit, fixed length compressed code. In an alternative embodiment, the compressed character string is represented as a variable length compressed code. The compression engine 129, when executing on the central processing unit 119, then stores the compressed character string in the compressed document 103.

The dictionary 125 preferably stores character strings in ROM in their uncompressed code and associates a unique code (typically a compressed code) with each character string. In the preferred embodiment, the size of the dictionary 125 is 64K and the unique code (i.e., the compressed code) associated with each character string is a 16 bit memory address which represents a memory location for each character string in the dictionary 125.

In the preferred embodiment, the dictionary 125 includes a word section 131, a pairs section 133, an ASCII section 135, and a formatting and punctuation characters section 137. The word section 131 stores whole words such as the character string "document". The pairs section 133 stores pairs of letters such as the character strings "AA" or "ZZ" and pairs of numbers such as the character strings "16" or "88". The formatting and punctuation character section 137 stores punctuation characters such as "," and "?" and also stores common formatting patterns such as "carriage-return linefeed". The ASCII section 135 stores ASCII characters and, in the preferred embodiment, stores the complete ASCII character set. It should be noted that in the preferred embodiment, the "compressed", 16-bit code of the present invention actually expands the "uncompressed" 8-bit ASCII code of each character in the ASCII section 135. Each section of the dictionary 125 is preferably kept in alphabetical order. FIG. 2 illustrates a typical dictionary 125.

The communications channel 117 transmits data between the host computer 109 and the remote computer 115. In order to process data received from the host computer 109, the remote computer 115 includes an input/output unit 139, a central processing unit 141, and a remote computer memory 143. In addition, the remote computer memory 143 includes a dictionary 145, a query engine 147, and a compressed document 149. The dictionary 145 has a word section 151, a pairs section 153, an ASCII section 155, and a formatting and punctuation characters section 157. In the preferred embodiment, the dictionary 145 is stored in ROM in the remote computer memory 143 and is identical to the dictionary 125 stored in the host computer memory 123. In the preferred embodiment, the compressed document 149 stored in the remote computer memory 143 is identical to the compressed document 103 stored in the host computer memory 123.

The query engine 147, when executing on the central processing unit 141, performs searches on the compressed document 149 using the dictionary 145 in order to retrieve information about the compressed document 149. The query engine 147, when executing on the central processing unit 141, includes a search program 159 and a convert program 161. The query engine 147 invokes the search program 159 to search the compressed document 149 based on search criteria contained in a query request entered on either the remote computer keyboard 111 or the remote computer mouse 113. The search criteria in the query request is received in an uncompressed code. The query engine 147, when executing on the central processing unit 141, invokes the convert program 161 to convert the search criteria from the uncompressed code to the compressed code of the present invention using the dictionary 145.

An example of the general operation of the computer system 100 (FIG. 1) will illustrate how the present invention searches for character strings in the compressed document 149 on the remote computer 115 while the character strings are stored in the compressed code of the present invention.

General Operation

Initially, the user of the host computer 109 or the remote computer 115 inputs a request to transfer the uncompressed document 101 from the host computer 109 to the remote computer 115. In response to the user request, the host computer 109 invokes the compression engine 129 which manages the conversion of the uncompressed document 101 into the compressed document 103. In the preferred embodiment, the compression engine 129 performs the steps of a method Compress which is set forth in more detail below in FIG. 3.

To convert the uncompressed document 101 into the compressed document 103, the compression engine 129 invokes the parser 127 which parses uncompressed character strings stored in the uncompressed document 101 and sends the parsed character strings back to the compression engine 129.

The compression engine 129 receives the parsed character string from the parser 127 and converts the parsed character string from its initial uncompressed code, for example the ASCII code, to the compressed code of the present invention. Any well known technique in the art for retrieving a compressed code from a dictionary can be used. For example, the method Compress, as set forth in detail below and shown in FIG. 3 can be used to retrieve the compressed code from the dictionary 125. Upon retrieval of the compressed code the present invention then stores the parsed character string, in the compressed code, in the compressed document 103.

Since the most common character in a typical document is the space character, it is important that the single space be represented with as few bits as possible. By assuming that there is a single space separating any two adjoining words, the present invention enables the use of no code whatsoever to encode the typical space character. Since there will be exceptions to the general rule of assuming a space character between words, the present invention preferably marks a section of the code space (for example, all word indices less than 1000) as words that abort the space assumption. In addition, the preferred dictionary 125 contains a RunOn character string whose sole purpose is to override the default insert space character.

After every character string from the uncompressed document 101 has been converted to the compressed code of the present invention and stored in the compressed document 103, the host computer 109 transfers the compressed document 103 from the host computer 109, over the communications channel 117, to the remote computer 115, where the remote computer 115 stores the compressed document 103 in the remote computer memory 143 as the compressed document 149.

Figure 13:
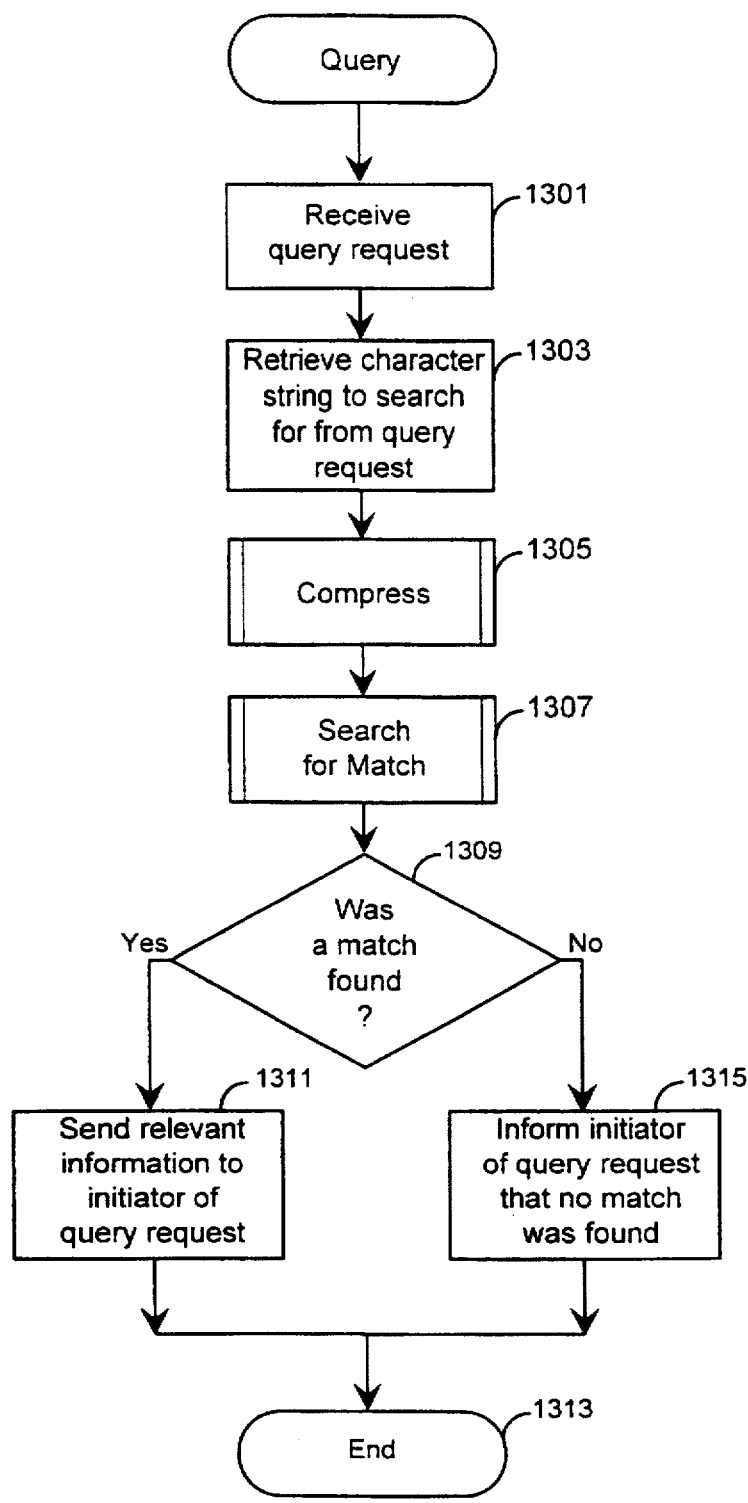
FIG. 13 is a flow diagram of a method Query used by the system of FIG. 1.

A user of the remote computer 115 typically inputs query requests using either the remote computer keyboard 111 or the remote computer mouse 113 in order to retrieve information from the compressed document 149. The remote computer 115 transfers the query request to the query engine 147 which searches the compressed document 149 based on search criteria contained in the query request. In the preferred embodiment, the query engine 147 performs the steps of a method Query which is set forth in more detail below and is shown in FIG. 13.

Upon receipt of the query request, the query engine 147 invokes the convert program 161 which retrieves the search criteria from the query request and converts the retrieved search criteria, using the dictionary 145, from its uncompressed code to the compressed code of the present invention. In the preferred embodiment, the convert program 161 performs the steps of the method Compress which is set forth in more detail below and is shown in FIG. 3.

Figure 14A:
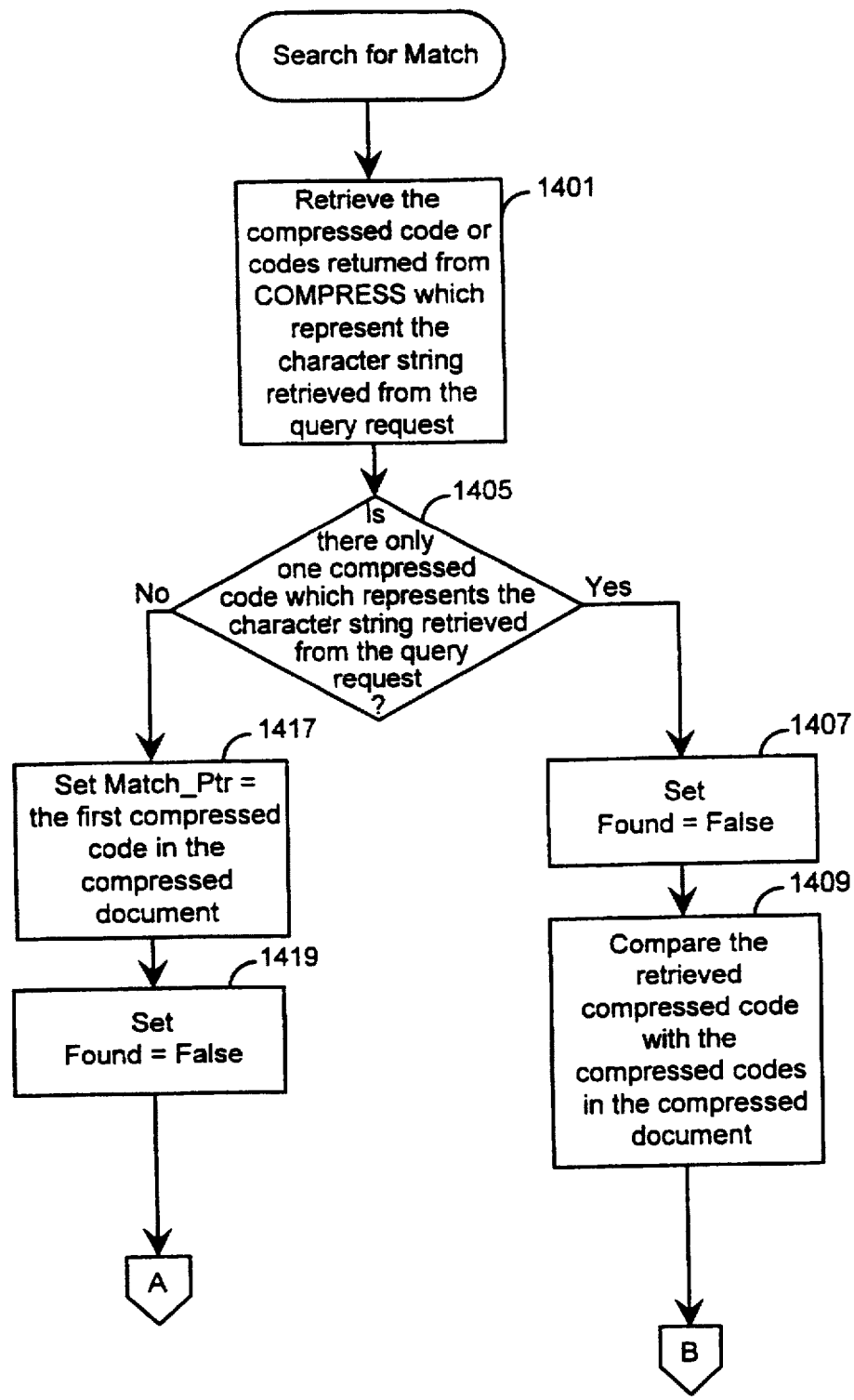
FIG. 14 is a flow diagram of a method SearchForMatch used by the system of FIG. 1.
Figure 14B:
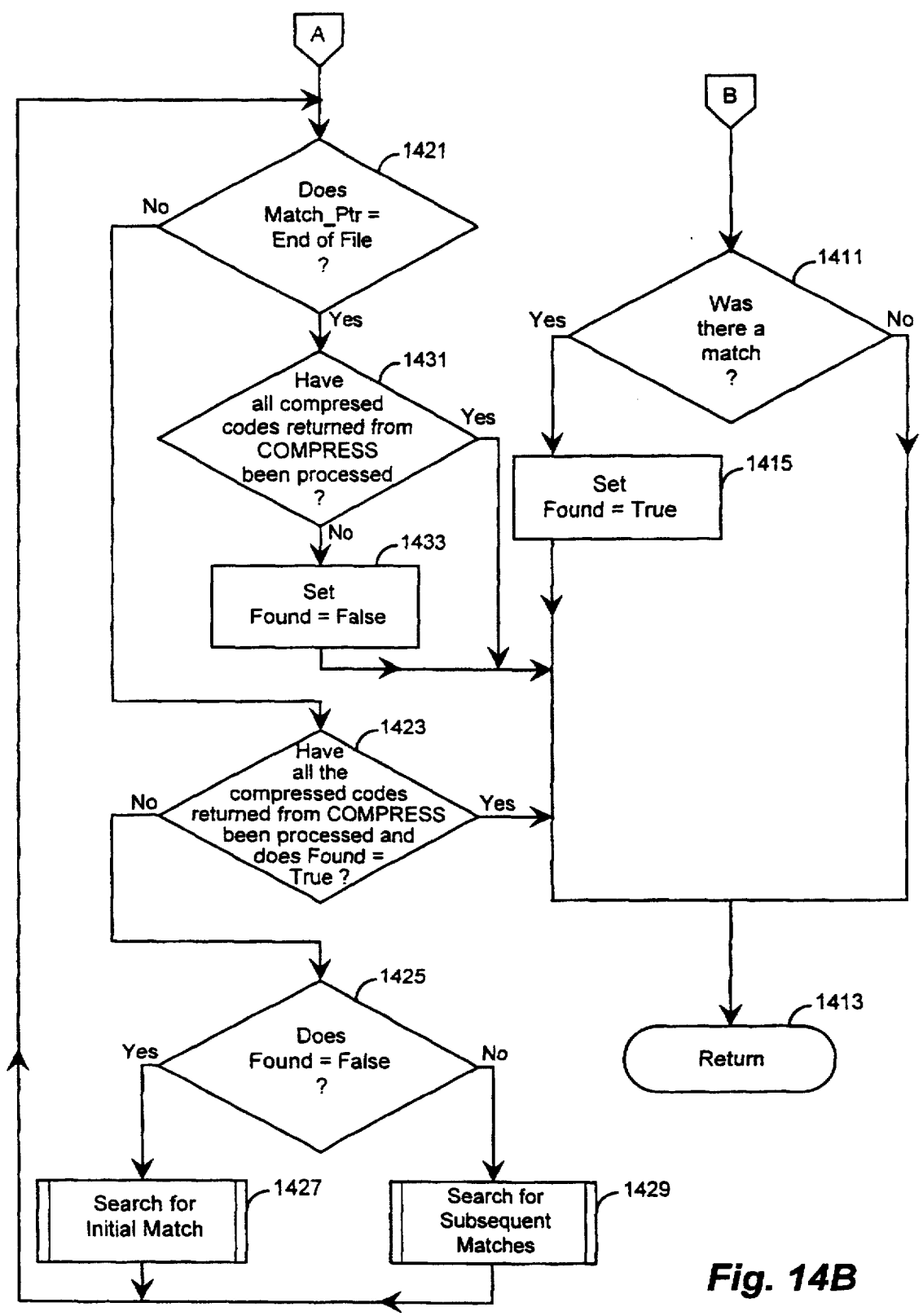

Upon completion of the conversion of the retrieved search criteria, the query engine 147 invokes the search program 159. The search program 159 receives the search criteria in the compressed code and searches the compressed document 149 for occurrences of the search criteria. The search program 159 then informs the user of the remote computer 115 of the results from the search. In the preferred embodiment, the search program 159 performs the steps of a method SearchForMatch which is set forth in more detail below and is shown in FIG. 14.

Flow Charts

Figure 3:
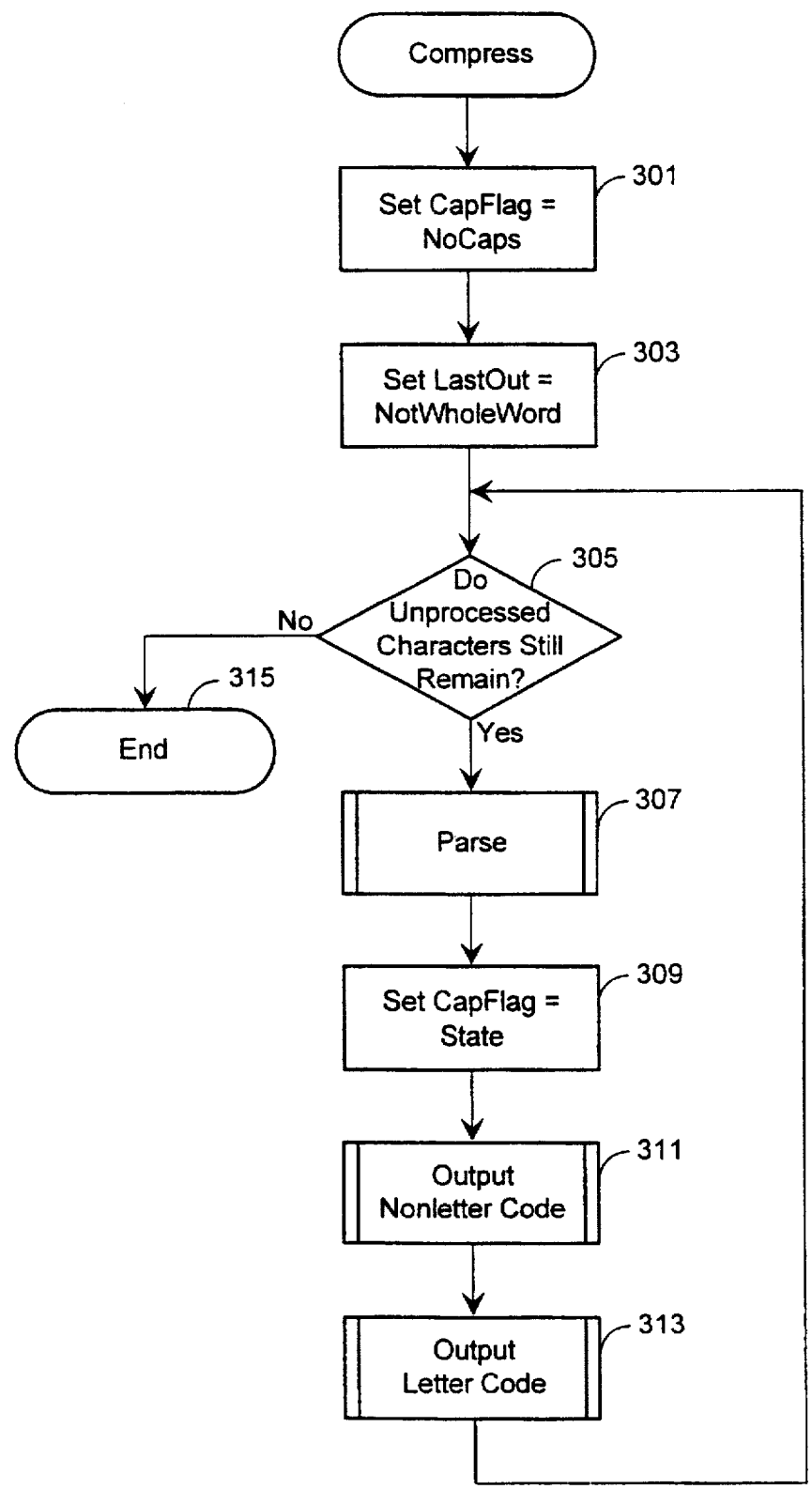
FIG. 3 is a flow diagram of a method Compress used by the system of FIG. 1.

FIG. 3 is a flow diagram of the method Compress which converts uncompressed codes of the uncompressed document 101 into the compressed document 103. The method Compress performs this conversion by parsing off one group of non-letter characters from the uncompressed document 101 followed by one group of letter characters from the uncompressed document 101 while the parsed letters fit into one of the acceptable capitalization classes of Nocaps, Firstcap, or Allcaps. The method Compress uses the variable Capflag to indicate the type of capitalization that exists in a string of letter characters retrieved from the uncompressed document 101 and stored in a variable called L$ (discussed in more detail below). The value Nocaps indicates that the string of characters stored in the variable L$ is not capitalized. The value Firstcap indicates that only the first character in the string of characters stored in the variable L$ is capitalized. The value Allcaps indicates that all of the characters stored in the variable L$ are capitalized.

Once the method Compress finishes parsing off the group of letter characters and the group of non-letter characters, and finishes setting the variable Capflag to the appropriate capitalization class, the method Compress retrieves compressed codes from the dictionary 125 which represent the group of letter characters and the group of non-letter characters. Upon completion of the method Compress, the uncompressed document 101 has been converted into the compressed document 103.

In the preferred embodiment, the compression engine 129 (FIG. 1) performs the steps of the method Compress (FIG. 3). In step 301, the method Compress sets the variable Capflag equal to the value Nocaps. In step 303, the method Compress initializes the variable Lastout to the value Notwholeword. The variable Lastout indicates whether a string of characters retrieved from the uncompressed document 101 and stored in the variable L$ was represented by a single compressed code retrieved from the dictionary 125 or by multiple compressed codes retrieved from the dictionary 125. If the string of characters is represented by the single compressed code then the variable Lastout is assigned the value Wholeword. If the string of characters is represented by multiple compressed codes then the variable Lastout is assigned the value Notwholeword.

Figure 4A:
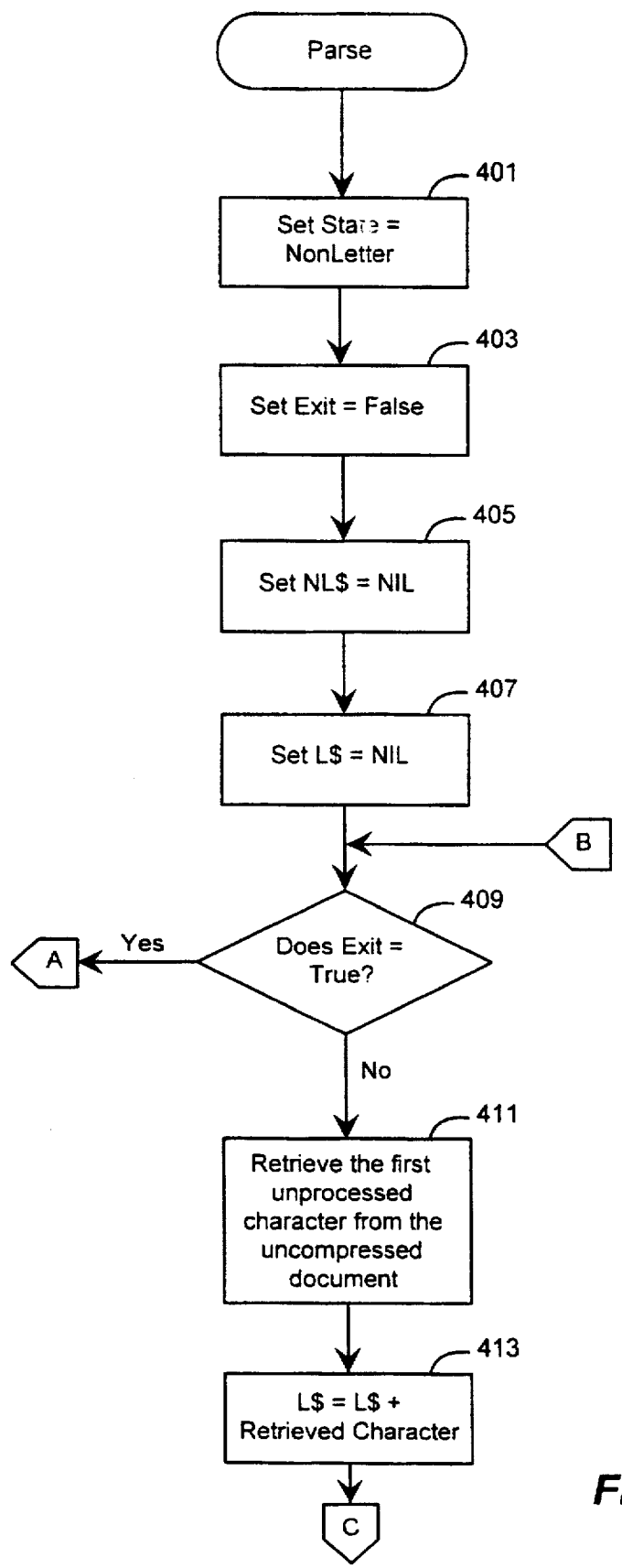
FIG. 4 is a flow diagram of a method Parse used by the system of FIG. 1.
Figure 4B:
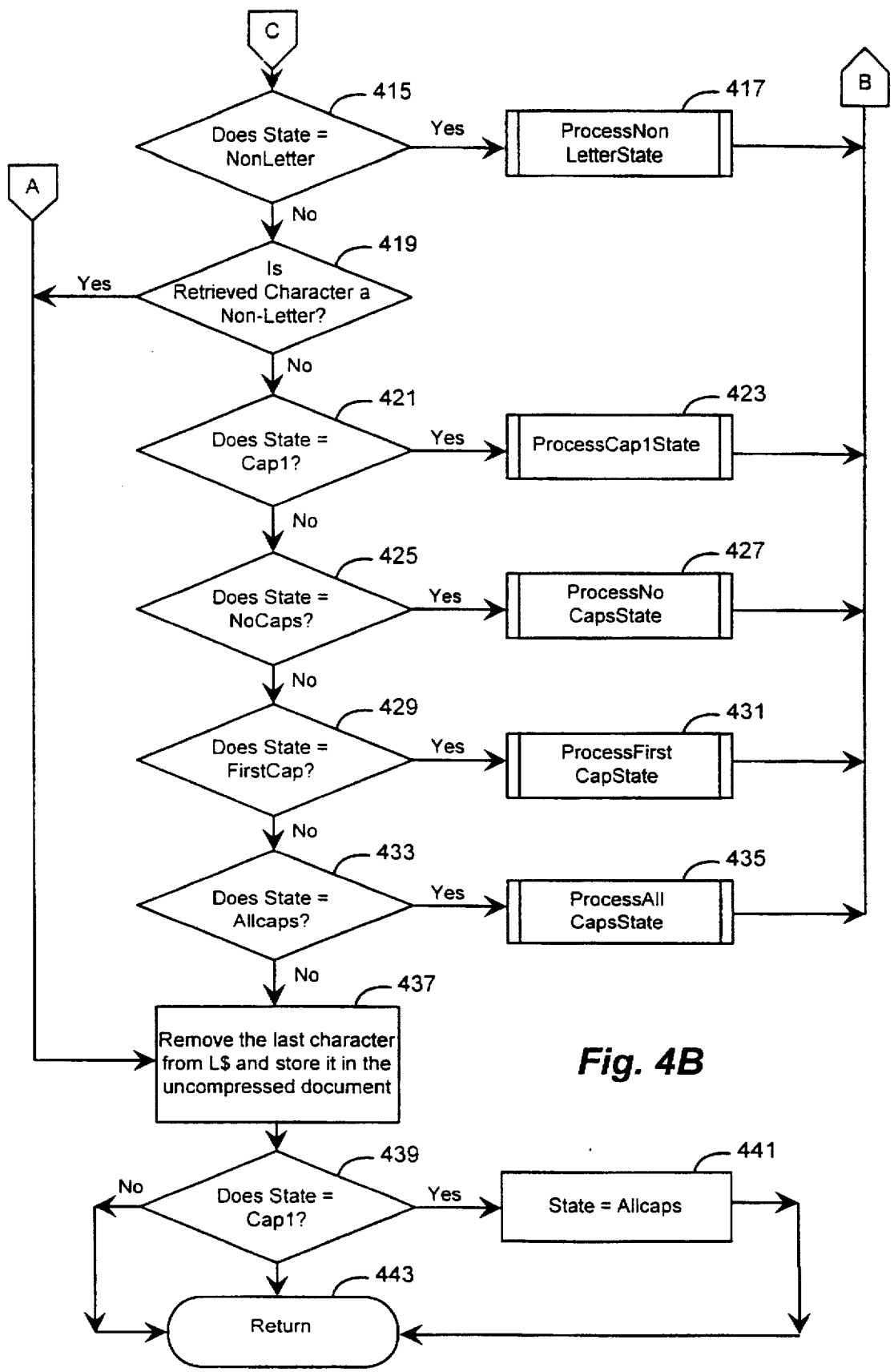

If the method Compress in step 305 determines that unprocessed characters still remain in the uncompressed document 101, the method Compress calls the method Parse in step 307. The method Parse parses off one group of non-letters from the uncompressed document 101 followed by one group of letters from the uncompressed document 101, while the letters fit into one of the acceptable capitalization classes of Allcaps, Firstcap, or Nocaps. The method Parse is discussed in more detail below and is shown in FIG. 4.

Upon completion of step 307 the method Compress sets the value of the variable Capflag equal to the value of a variable State as in step 309. The variable State indicates the capitalization class of the group of letters retrieved from the uncompressed document 101 and is stored in the variable L$ by the method Parse in step 307. The value assigned to the variable State will be either Nocaps, Allcaps or Firstcap.

Figure 5:
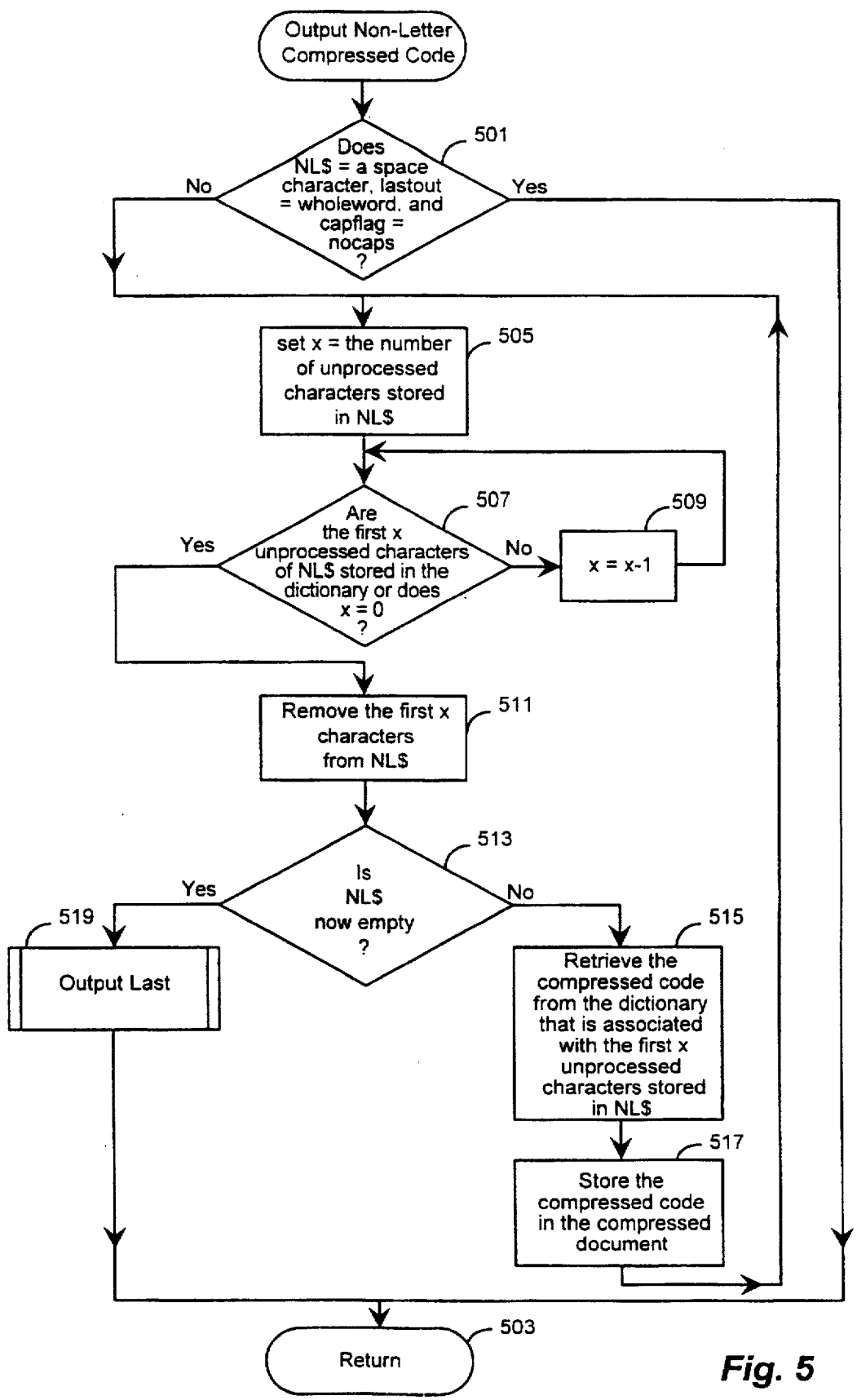
FIG. 5 is a flow diagram of a method OutputNonLetterCompressedCode used by the system of FIG. 1.

In step 311, the method Compress calls the method OutPutNonLetterCompressedCode. The method OutPutNonLetterCompressedCode retrieves a compressed code or compressed codes from the dictionary 125 which represent the group of non-letters retrieved from the uncompressed document 101 by the method Parse. The method OutPutNonLetterCompressedCode then stores the retrieved compressed code(s) in the compressed document 103. The method OutPutNonLetterCompressedCode is discussed in more detail below and is shown in FIG. 5.

Figure 6:
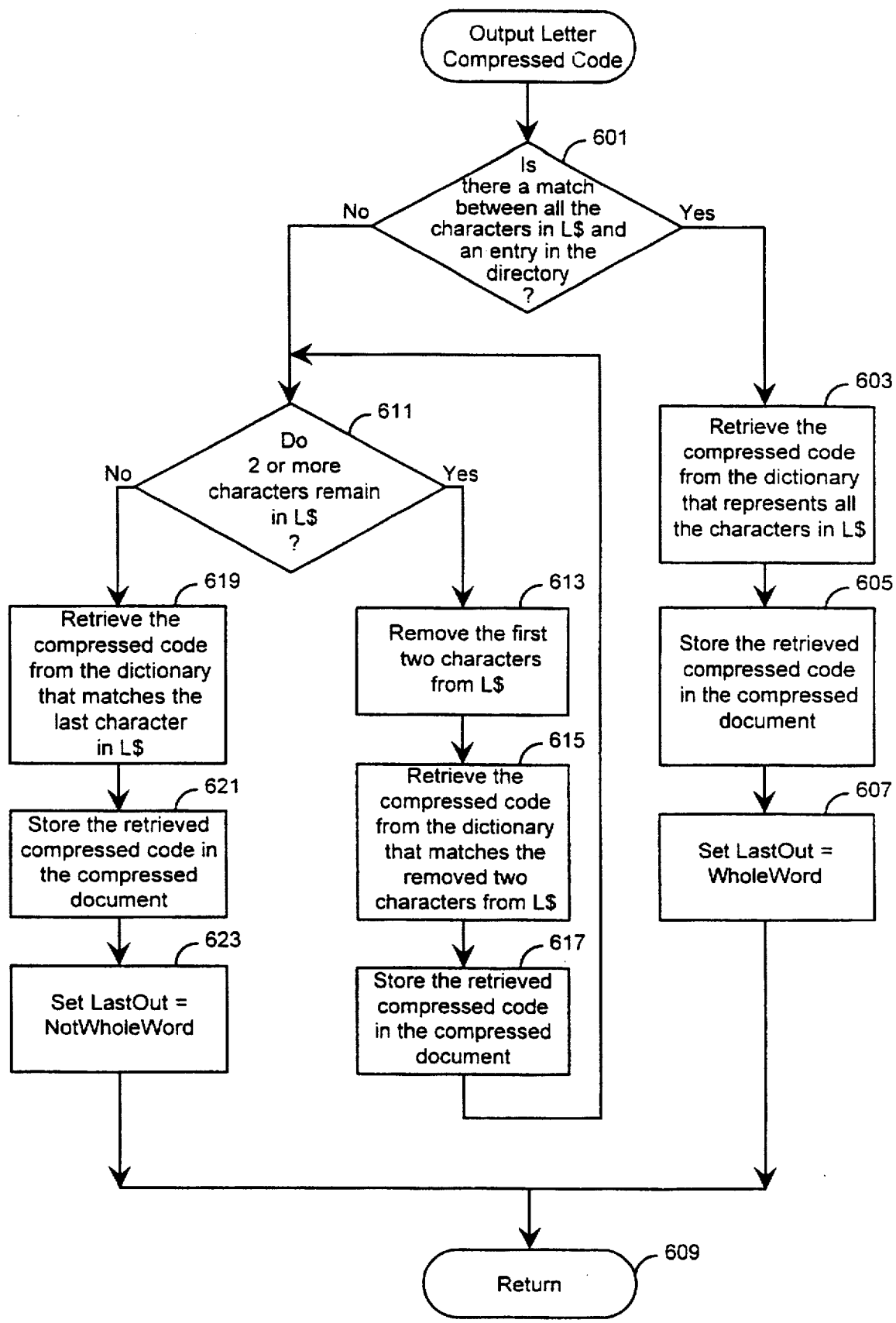
FIG. 6 is a flow diagram of a method OutputLetterCompressedCode used by the system of FIG. 1.

Upon completion of step 311 the method Compress, in step 313, calls the method OutputLetterCode. The method OutputLetterCode retrieves a compressed code or compressed codes from the dictionary 125 which represent the group of letters retrieved from the uncompressed document 101 by the method Parse. The method OutputLetterCode then stores the retrieved compressed code(s) in the compressed document 103. The method OutputLetterCompressedCode is discussed in more detail below and is shown in FIG. 6.

Upon completion of step 313 the method Compress continues processing with step 305. If, in step 305, the method Compress determines that all the characters in the uncompressed document 101 have been processed then in step 315, the method Compress ends processing the data in the uncompressed document 101. However, the host computer 109 may continue processing other data unrelated to the uncompressed document 101.

FIG. 4 is a flow diagram of the method Parse which parses off one group of non-letter characters (the group may be a nil group) followed by one group of letter characters (the group may be a nil group) where the letters fit into one of the acceptable capitalization classes of Allcaps, Firstcap, or Nocaps (defined above in the discussion of the method Compress of FIG. 3). Letter characters are typically distinguished from non-letter characters by determining if the value of the code representing the character falls within a range of values occupied by letter characters or whether the value of the code falls within a range of values occupied by non-letter characters. It should be noted that the case where the parsed group of non-letters is nil or where the parsed group of letters is nil typically occurs while parsing the beginning of the uncompressed document 101 or the end of the uncompressed document 101. The nil case can also occur at other points in the uncompressed document 101 where the capitalization is atypical. For example, if the string "123ThisThing" were stored in the uncompressed document 101, then the method Parse would parse off the group of non-letter characters "123" and would then parse off the group of letter characters "This" into a group of letters with the Firstcap capitalization class. During the next iteration of the method Parse, the string "Thing" would parse into the nil non-letter group followed by the letter group consisting of the word "Thing".

Before discussing the steps of the method Parse it will be helpful to first define some of the variables, values, and data structures used in the steps of the method Parse. In the preferred embodiment the data structure NL$ stores a group of non-letters retrieved from the uncompressed document 101. The data structure L$ preferably stores a group of letters retrieved from the uncompressed document 101. The variable State classifies a group of characters currently being processed by the method Parse. The variable State is set to the value Non-letter when the non-letters stored in the data structure NL$ are being processed. When the letters stored in the data structure L$ are being processed, the value of the variable State will be either Cap1, Nocaps, Firstcap, or Allcaps. The value Cap1 indicates that the first letter stored in L$ is a capital letter. The variable State is only temporarily assigned the value Cap1. As additional letters are retrieved from uncompressed document 101 and stored in the data structure L$, the value of the variable State may be changed to the value Firstcap. In the preferred embodiment the method Parse is performed by the parser 127 (FIG. 1).

Figure 7:
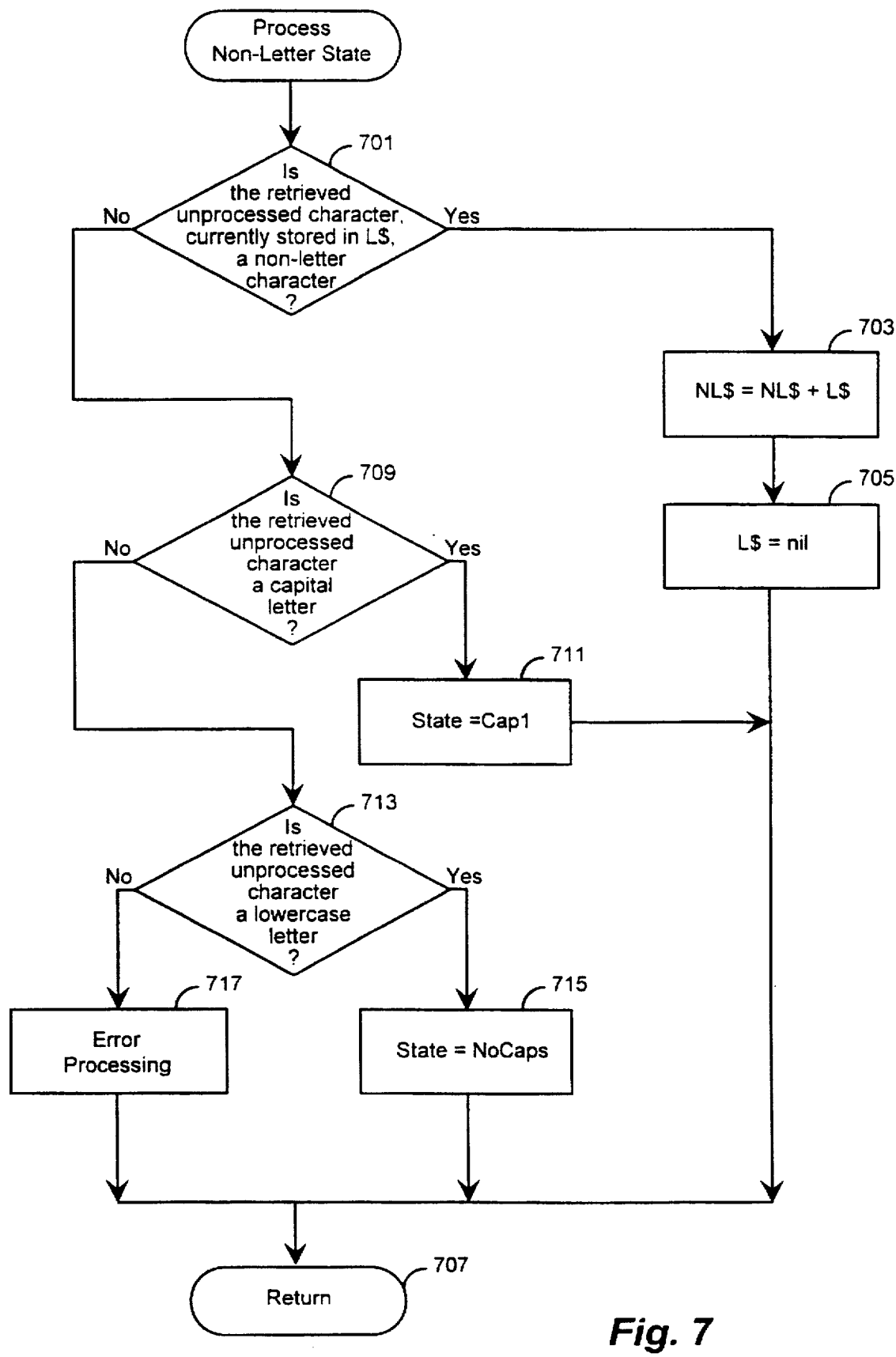
FIG. 7 is a flow diagram of a method ProcessNonLetterState used by the system of FIG. 1.

In step 401 of FIG. 4 the method Parse sets the variable State equal to the value Non-letter. In step 403 the method sets the variable Exit equal to the value False, thereby initializing the variable Exit. In step 405 the method sets the variable NL$ equal to the value nil, thereby initializing the variable NL$. In step 407 the method sets the variable L$ equal to the value Nil, thereby initializing the variable L$. In step 409, if the method Parse determines that the variable Exit does not equal True (i.e., that the variable Exit is set to the value False) then in step 411, the method retrieves the first unprocessed character from the uncompressed document 101. In step 413, the method sets the data structure L$ equal to the previous value of L$ plus the retrieved character. In step 415 if the method Parse determines that the variable State is equal to the value non-letter, then in step 417, the method Parse calls the method ProcessNonLetterState. The method ProcessNonLetterState stores retrieved non-letter characters in NL$ until the method ProcessNonLetterState receives a retrieved letter character. Upon retrieval of the letter character, the method ProcessNonLetterState stores the retrieved letter character in L$ and sets the variable State equal to the capitalization class of the retrieved letter. The method ProcessNonLetterState is described in more detail below and is shown in FIG. 7. Upon completion of step 417 processing continues with step 409.

Figure 8:
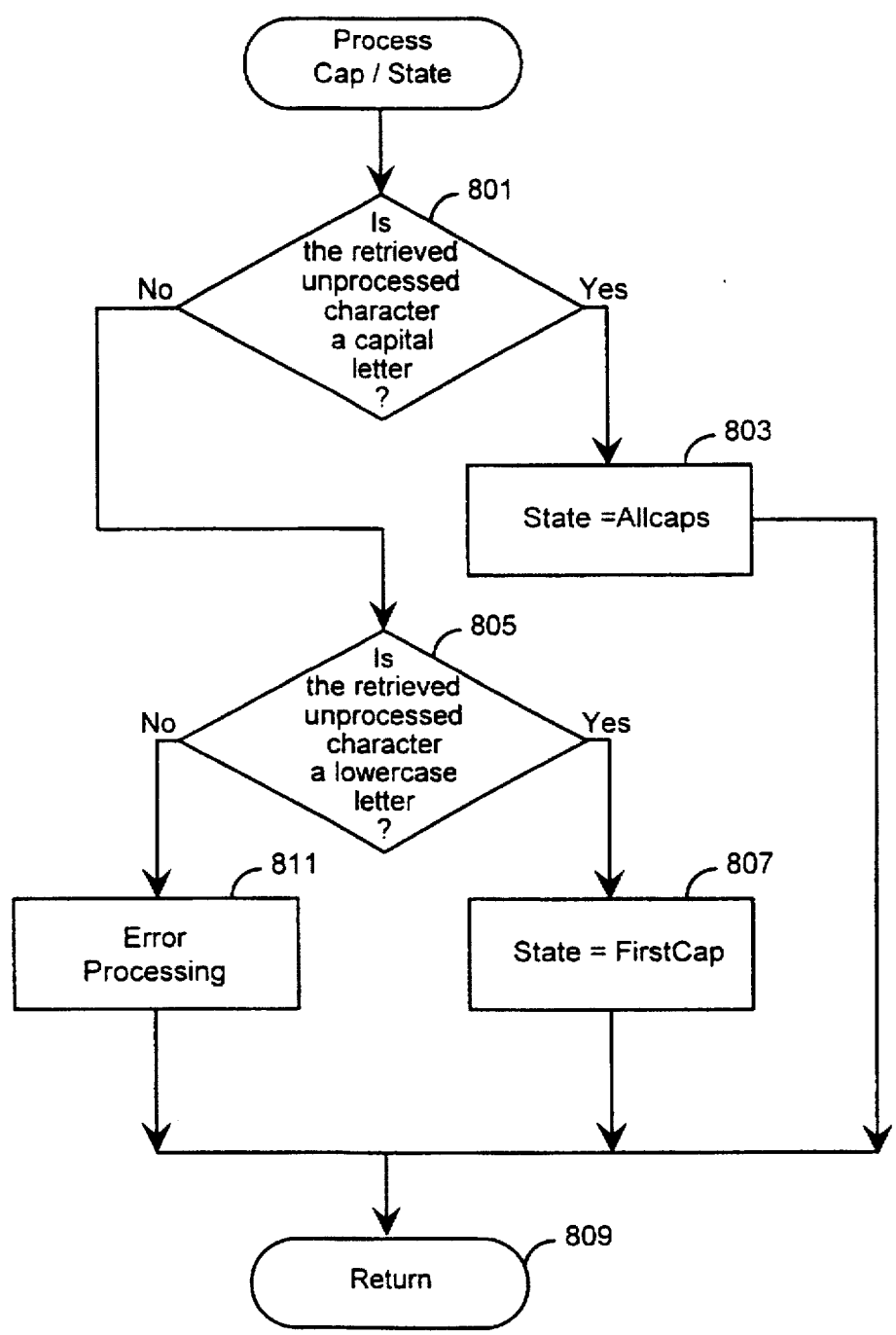
FIG. 8 is a flow diagram of a method ProcessCap1State used by the system of FIG. 1.

Returning to the discussion of step 415, if the method Parse determines that the variable State is not set to the value Non-letter then, in step 419, the method Parse determines whether the retrieved character is a non-letter. Letter characters are typically distinguished from non-letter characters by determining if the value of the code representing the character falls within a range of values occupied by letter characters or whether the value of the code falls within a range of values occupied by non-letter characters. If the retrieved character is not a non-letter (i.e., is a letter) then in step 421, the method determines whether the variable State is set to the value Cap1. If the variable State is set to the value Cap1 then, in step 423, the method Parse calls the method ProcessCap1State. The method ProcessCap1State assigns the value Allcaps or the value Firstcap to the variable State based on the capitalization class of the character retrieved from the uncompressed document 101 in step 411. The method ProcessCap1State is discussed in more detail below and is shown in FIG. 8. Upon completion of step 423 processing continues with step 409.

Figure 9:
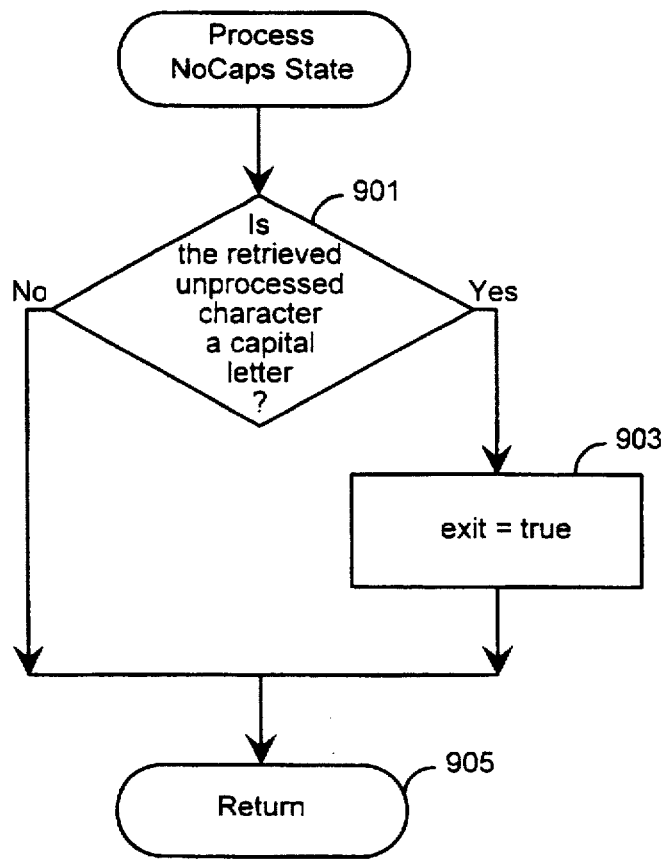
FIG. 9 is a flow diagram of a method ProcessNoCapsState used by the system of FIG. 1.

Returning to the discussion of step 421, if the method Parse determines that the variable State is not set to the value Cap1 then in step 425, the method Parse determines whether the variable State is set to the value Nocaps. If the variable State is set to the value Nocaps, then in step 427, the method Parse calls the method ProcessNoCapsState. The method ProcessNoCapsState sets the variable Exit to the value True if the character retrieved from the uncompressed document 101 in step 411 is a capital letter. The method ProcessNoCapsState is discussed in more detail below and is shown in FIG. 9. Upon completion of step 427 processing continues with step 409.

Figure 10:
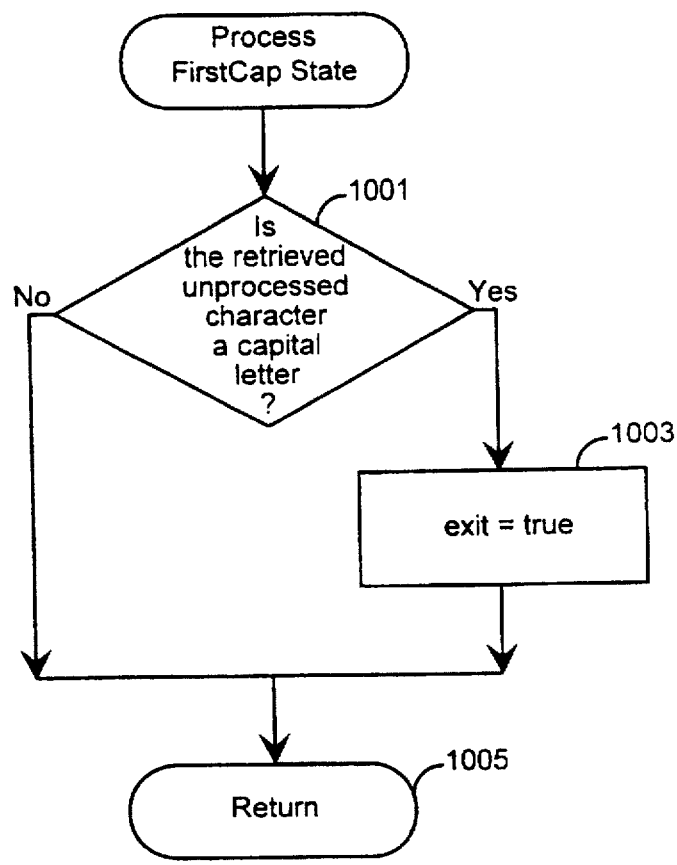
FIG. 10 is a flow diagram of a method ProcessFirstCapState used by the system of FIG. 1.

Returning to the discussion of step 425, if the method Parse determines that the variable State is not set to the value Nocaps, then in step 429, the method Parse determines whether the variable State is set to the value Firstcap. If the variable State is set to the value Firstcap, then in step 431 the method Parse calls the method ProcessFirstCapState. The method ProcessFirstCapState sets the variable Exit to the value True if the character retrieved from uncompressed document 101 in step 411 is a capital letter. The method ProcessFirstCap is discussed in more detail below and is shown in FIG. 10. Upon completion of step 431 processing continues with step 409.

Figure 11:
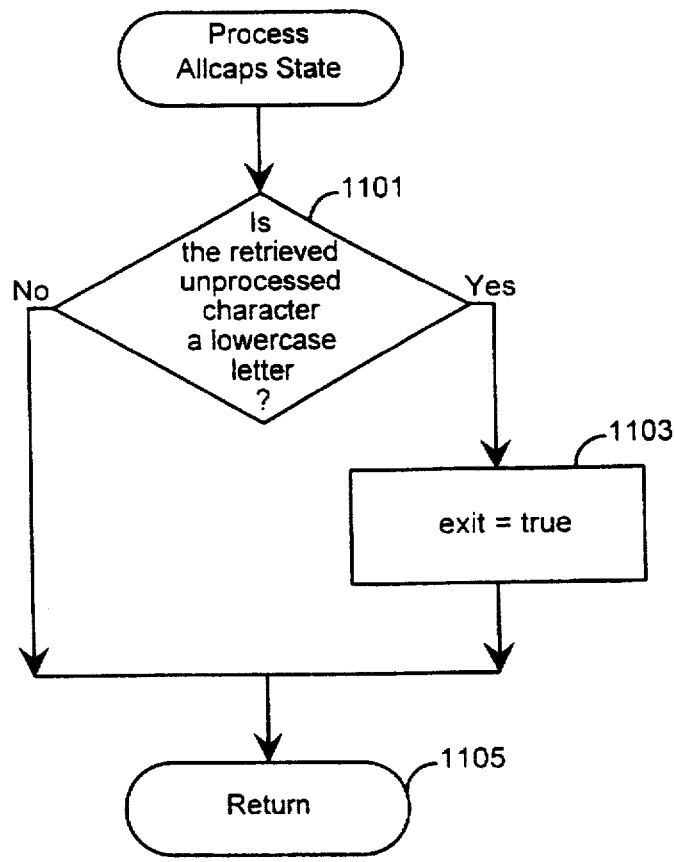
FIG. 11 is a flow diagram of a method ProcessAllCapsState used by the system of FIG. 1.

Returning to the discussion of step 429, if the method Parse determines that the variable State is not set to the value Firstcap then in step 433, the method Parse determines whether the variable State is set to the value Allcaps. If the variable State is set to the value Allcaps, then in step 435 the method Parse calls the method ProcessAllCapsState. The method ProcessAllCapsState sets the variable Exit to True if the character retrieved from the uncompressed document 101 in step 411 is a lower case letter. The method ProcessAllCapsState is discussed in more detail below and is shown in FIG. 11. Upon completion of step 435 processing continues with step 409.

Returning to the discussion of step 433, if the method Parse determines that the variable State is not set to the value Allcaps then in step 437, the method Parse removes the last character from the data structure L$ and stores it back in the uncompressed document 101. While the present example discusses removing characters from L$ and storing the removed characters each in the uncompressed document 101, those of ordinary skill in the art will understand that the process can also be implemented using a pointer to a specific position in the uncompressed document 101 that is moved forward or backward. If in step 439 the method Parse determines that the variable State is set to the value Cap1, then in step 441 the method Parse sets the variable State equal to the value Allcaps. In step 443 the method Parse returns processing control to the method Compress (FIG. 3). Returning to the discussion of step 439, if the method Parse determines that the variable State is not set to the value Cap1 then in step 443, the method Parse returns processing control to the method Compress (FIG. 3).

Returning to the discussion of step 419, if the method Parse determines that the retrieved character is a non-letter, then steps 437 through 443 are performed. In step 437, the method Parse removes the last character from the data structure L$ and stores it in the uncompressed document 101. If in step 439 the method Parse determines that the variable State is set to the value Cap1 then in step 441, the method Parse sets the variable State equal to the value Allcaps. In step 443 the method Parse returns processing control to the method Compress (FIG. 3). Returning to the discussion of step 439, if the method Parse determines that the variable State is not set to the value Cap1 then in step 443, the method Parse returns processing control to the method Compress (FIG. 3).

Returning to the discussion of step 409, if the method Parse determines that the variable Exit is set to the value True then steps 437 through 443 are performed. In step 437 the method Parse removes the last character from the data structure L$ and stores it back in the uncompressed document 101. If in step 439 the method Parse determines that the variable State is set to the value Cap1 then in step 441, the method Parse sets the variable State equal to the value Allcaps. In step 443 the method Parse returns processing control to the method Compress (FIG. 3). Returning to the discussion of step 439, if the method Parse determines that the variable State is not set to the value Cap1 then in step 443, the method Parse returns processing control to the method Compress (FIG. 3).

FIG. 5 is a flow diagram of the method OutputNonLetterCompressedCode which stores in the compressed document 103 a single compressed code or multiple compressed codes which represent a group of non-letter characters retrieved from the uncompressed document 101. The method OutputNonLetterCompressedCode converts the group of non-letter characters to the compressed code by finding the longest set of non-letter characters from the group of non-letter characters retrieved from the uncompressed document 101, which match an entry in the dictionary 125. The method OutputNonLetterCompressedCode then retrieves the compressed code for the matched set of non-letter characters. This process iterates until the entire group of non-letter characters has been converted to the compressed code. The method OutputNonLetterCompressedCode will always be able to match at least the first non-letter character in the group of non-letter characters retrieved from the uncompressed document 101 because every ASCII character is preferably stored in the ASCII section 135 of the dictionary 125. In the preferred embodiment, the method OutputNonLetterCompressedCode is performed by the compression engine 129.

If in step 501, the method OutputNonLetterCompressedCode, determines that NL$ contains only a space character, and that the variable Lastout is set equal to the value Wholeword, and that the variable Capflag is set equal to the value Nocaps, then in step 503 the method OutputNonLetterCompressedCode returns processing control to the method Compress (FIG. 3). In this way, the present invention can avoid storing the space character in the compressed document 103 when the conditions set forth in step 501 are met.

Returning to the discussion of step 501, if the method OutputNonLetterCompressedCode determines that either NL$ contains more than the space character, or determines that the variable Lastout is not set equal to the value Wholeword, or determines that the variable Capflag is not set equal to the value Nocaps, then in step 505 the method sets the variable X equal to the number of characters stored in the data structure NL$. In step 507, the method determines if the first X characters of NL$ are stored in the dictionary 125. If the method determines that the first X characters of NL$ are not stored in the dictionary 125 then in step 509 the method decrements the value of X. Upon completion of step 509 processing continues with step 507. In this way, the method OutputNonLetterCompressedCode finds the longest group of characters from NL$ which are also stored in the dictionary 125.

Returning to the discussion of step 507, if the method determines that the first X characters of NL$ are stored in the dictionary 125 then in step 511, the method removes the first X characters from NL$. In step 513 if NL$ is not now empty then in step 515, the method retrieves the compressed code from the dictionary 125 that is associated with the first X characters removed NL$. In step 517 the method then stores the retrieved compressed code in the compressed document 103. Upon completion of step 517 the method OutputNonLetterCompressedCode, in step 503, returns processing control to the method Compress (FIG. 3).

Figure 12:
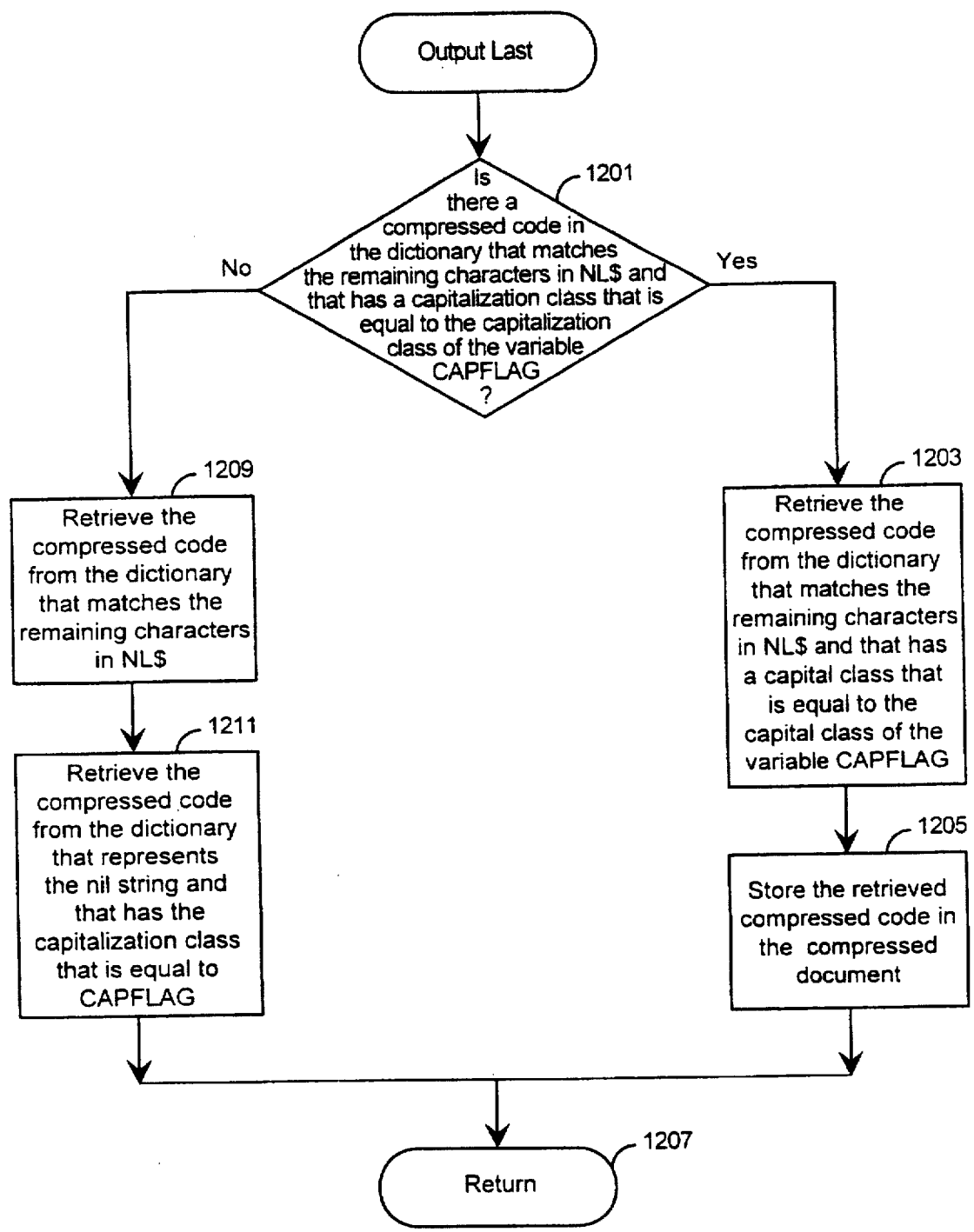
FIG. 12 is a flow diagram of a method OutputLast used by the system of FIG. 1.

Returning to the discussion of step 513, if the method determines that NL$ is now empty then in step 519, the method OutputNonLetterCompressedCode calls the method OutputLast. The method OutputLast outputs a single compressed code or multiple compressed codes which represent the last characters removed from NL$. The method OutputLast is described in more detail below and is shown in FIG. 12. Upon completion of step 519 the method OutputNonLetterCompressedCode returns processing control to the method Compress (FIG. 3).

FIG. 6 is a flow diagram of the method OutputLetterCompressedCode which stores in the compressed document 103 a single compressed code or multiple compressed codes which represent a group of letters retrieved from the uncompressed document 101 and stored in the data structure L$. The method OutputLetterCompressedCode converts the group of letter characters to the compressed code of the present invention by finding the longest set of letter characters from the group of letter characters retrieved from the uncompressed document 101, which match an entry in the dictionary 125. The method OutputLetterCompressedCode then retrieves the compressed code for the matched set of letter characters. This process iterates until the entire group of letter characters has been converted to the compressed code. The method OutputLetterCompressedCode will always be able to match at least the first letter character in the group of letter characters retrieved from the uncompressed document 101 because every ASCII character is preferably stored in the ASCII section 135 of the dictionary 125. In the preferred embodiment method OutputLetterCompressedCode is performed by the compression engine 129.

In step 601 the method determines whether there is a match between all the letter characters stored in L$ and an entry in the dictionary 125. If there is a match between all the letter characters stored in L$ and an entry in the dictionary 125 then in step 603, the method retrieves the compressed code from the dictionary 125 that represents all the characters in L$. In step 605 the method stores the retrieved compressed code in the compressed document 103. In step 607 the method sets the variable Lastout equal to the value Wholeword. In step 609 the method OutputLetterCompressedCode returns processing control to the method Compress (FIG. 3).

Returning to the discussion of step 601, if the method OutputLetterCompressedCode determines that there is not a match between all the characters in L$ and an entry in the dictionary 125, then in step 611, the method determines whether two or more characters remain in L$. If two or more characters do remain in L$, then in step 613, the method removes the first two characters from L$. In step 615 the method retrieves the compressed code from the dictionary 125 that matches the removed two characters from L$. In step 617 the method stores the retrieved compressed code in the compressed document 103. Upon completion of step 617, processing continues with step 611.

Returning to the discussion of step 611, if the method determines that two or more characters do not remain in L$, then in step 619, the method retrieves the compressed code from the dictionary 125 that matches the last character in L$. In step 621 the method stores the retrieved compressed code in the compressed document 103. In step 623 the method sets the variable Lastout equal to the value Notwholeword. Upon completion of step 623 the method OutputLetterCompressedCode, in step 609, returns processing control to the method Compress (FIG. 3).

FIG. 7 is a flow diagram of the method ProcessNonLetterState which stores non-letter characters retrieved from the uncompressed document 101 in the data structure NL$. The method ProcessNonLetterState begins by storing a retrieved character in the data structure L$. If the retrieved character is a non-letter character then NL$ is set equal to NL$+L$. Then L$ is set to nil. This process of storing non-letter characters in NL$ and initializing the value of L$ continues until a letter character is retrieved. In response to the retrieval of the letter character, the value of the variable State (discussed in more detail below) is set to Cap1 if the retrieved letter is a capital letter or is set to the NoCaps if the retrieved letter is a lowercase letter. In the preferred embodiment, the method ProcessNonLetterState is performed by the parser 127 (FIG. 1).

In step 701 the method determines if the unprocessed character retrieved from the uncompressed document 101 in step 411 of the method Parse (FIG. 4) and currently stored in the data structure L$ is a non-letter character. If the retrieved unprocessed character currently stored in L$ is a non-letter character, then in step 703 the method sets a current value of the data structure NL$ equal to NL$ plus L$. In step 705 the method sets the value of L$ equal to the value Nil. In step 707 the method ProcessNonLetterState returns processing control to the method Parse (FIG. 4).

Returning to the discussion of step 701, if the method determines that the retrieved unprocessed character currently stored in L$ is a letter character, then in step 709 the method determines whether the letter character is a capital letter. If the method determines that the retrieved unprocessed character is a capital letter, then in step 711 the method sets the variable State equal to the value Cap1. Upon completion of step 711 the method ProcessNonLetterState, in step 707, returns processing control to the method Parse (FIG. 4).

Returning to the discussion of step 709, if the method ProcessNonLetterState determines that the retrieved unprocessed character is not a capital letter then in step 713, the method determines whether the retrieved unprocessed character is a lower case letter. If the method determines that the retrieved unprocessed character is a lower case letter, then in step 715 the method sets the variable State equal to the value Nocaps. Upon completion of step 715 the method ProcessNonLetterState returns processing control to the method Parse (FIG. 4).

Returning to the discussion of step 713, if the method determines that the retrieved unprocessed character is not a lower case character, then in step 717 the method performs error processing. Upon completion of step 717 the method ProcessNonLetterState returns processing control to the method Parse (FIG. 4).

FIG. 8 is a flow diagram of the method ProcessCap1State. When the method ProcessCap1State begins processing, the method Parse (FIG. 4) has already retrieved a letter character from the uncompressed document 101 (FIG. 1) and has determined that the letter character is a capital letter. Given that the first letter in a group of letters is a capital letter, the capitalization class of the group of letters must be either FirstCap if the second letter in the group of letters is a lowercase letter, or the capitalization class of the group of letters must be Allcaps if the second letter in the group of letters is a capital letter. In the preferred embodiment, the method ProcessCap1State is performed by the parser 127 (FIG. 1). If in step 801 the method ProcessCap1State determines that the retrieved unprocessed character is a capital letter, then in step 803 the method sets the variable State equal to the value Allcaps. Upon completion of step 803, the method ProcessCap1State, in step 809, returns processing control to the method Parse (FIG. 4).

Returning to the discussion of step 801, if the method determines that the retrieved unprocessed character is not a capital letter, then in step 805 the method determines whether the retrieved unprocessed character is a lower case letter. If the retrieved unprocessed character is a lower case letter, then in step 807 the method sets the variable State equal to the value of Firstcap. Upon completion of step 807 the method ProcessCap1State, in step 809, returns processing control to the method Parse (FIG. 4).

Returning to the discussion of step 805, if the retrieved unprocessed character is not a lower case letter, then in step 811 the method performs error processing. Upon completion of step 811 the method ProcessCap1State, in step 809, returns processing control to the method Parse (FIG. 4).

FIG. 9 is a flow diagram of the method ProcessNoCapsState. When the method ProcessNoCapsState begins processing, the method Parse (FIG. 4) has already retrieved a letter character from the uncompressed document 101 (FIG. 1) and has determined that the letter character is a lowercase letter. Given that the first letter in a group of letters is a lowercase letter, the capitalization class of the group of letters must be NoCaps. Therefore, the method ProcessNoCapsState continues processing retrieved letter characters until a capital letter is encountered. When the capital letter is encountered, a variable Exit is set equal to the value True, thus indicating to the method Parse (FIG. 4) that the process of retrieving a group of letters of the NoCaps capitalization class has been completed. In the preferred embodiment, the method ProcessNoCapsState is performed by the parser 127 (FIG. 1). If in step 901 the method determines that the unprocessed character retrieved in step 411 of the method Parse (FIG. 4) is a capital letter, then in step 903 the method sets the variable Exit equal to the value True. Upon completion of step 903 the method ProcessNoCapsState, in step 905, returns processing control to the method Parse (FIG. 4).

Returning to the discussion of step 901, if the method determines that the retrieved unprocessed character is not a capital letter, then in step 905 the method ProcessNoCapsState returns processing control to the method Parse (FIG. 4).

FIG. 10 is a flow diagram of the method ProcessFirstCapState. When the method ProcessFirstCapState begins processing, the method Parse (FIG. 4) has already retrieved a group of letters, the first letter in the group being a capital letter and the remaining letters in the group being lowercase letters. Because the capitalization class of the group of letters must be FirstCap, the method ProcessFirstCapState continues processing letter characters until a capital letter is encountered. When the capital letter is encountered, a variable Exit is set equal to the value True, thus indicating to the method Parse (FIG. 4) that the process of retrieving a group of letters of the FirstCap capitalization class has been completed. In the preferred embodiment, the method ProcessFirstCapState is performed by the parser 127 (FIG. 1). If in step 1001 the method determines that the unprocessed character retrieved in step 411 of the method Parse (FIG. 4) is a capital letter, then in step 1003 the method sets the variable Exit equal to the value True. Upon completion of step 1003 the method ProcessFirstCapState, in step 1005, returns processing control to the method Parse (FIG. 4).

Returning to the discussion of step 1001, if the retrieved unprocessed character is not a capital letter, then in step 1005 the method ProcessFirstCapState returns processing control to the method Parse (FIG. 4).

FIG. 11 is a flow diagram of the method ProcessAllCapsState. When the method ProcessAllcapsState begins processing, the method Parse (FIG. 4) has already retrieved a group of letters, all of which are capital letters. Because the capitalization class of the group of letters must be Allcaps, the method ProcessAllcapsState continues processing letter characters until a lowercase letter is encountered. When the lowercase letter is encountered a variable Exit is set equal to the value True, thus indicating to the method Parse (FIG. 4) that the process of retrieving a group of letters of the Allcaps capitalization class has been completed. In the preferred embodiment, the method ProcessAllCapsState is performed by the parser 127 (FIG. 1). In step 1101 if the method determines that the retrieved unprocessed character is a lower case character, then in step 1103 the method sets the variable Exit equal to the value True. Upon completion of step 1103 the method ProcessAllCapsState, in step 1105, returns processing control to the method Parse (FIG. 4).

Returning to the discussion of step 1101, if the method determines that the retrieved unprocessed character is not a lower case letter then in step 1105, the method ProcessAllCapsState returns processing control to the method Parse (FIG. 4).

FIG. 12 is a flow diagram of the method OutputLast, which stores in the compressed document 103, a single compressed code or multiple compressed codes which represent the remaining characters in the data structure NL$ and the capitalization class of the variable Capflag. The method OutputLast first determines if the dictionary 125 contains a single compressed code which represents both the remaining characters in the data structure NL$ and the capitalization class of the variableCapflag. For example, if the remaining character in NL$ is a Period, and the capitalization class of the variable Capflag is FirstCap then the method OutputLast retrieves from the dictionary 125 the compressed code 0111 0101 0011 0111 which is associated with the entry PeriodFirstcap. Then the method OutputLast stores the compressed code in the compressed document 103. However, if there is not a single compressed code which represents both the remaining characters in NL$ and the capitalization class of the variableCapflag then the method OutputLast retrieves from the dictionary 125 separate compressed codes for the remaining characters in NL$ and the nil string that has a capitalization class equal to Capflag. For example, if the remaining character in NL$ is a Question Mark and the capitalization class of the variable Capflag is FirstCap then the method OutputLast retrieves from the dictionary 125 the compressed code 0111 0101 0011 1000 which is associated with the entry Question Mark, and also retrieves the compressed code 0111 0101 0011 0100 for the entry Nil String-FirstCap. The method OutputLast then stores both compressed codes in the compressed document 103. In the preferred embodiment, the method OutputLast is performed by the compression engine 129 (FIG. 1).

In step 1201 the method OutputLast determines if there is a single compressed code in the dictionary 125 that matches the remaining characters in NL$ and that has a capitalization class that is equal to the capitalization class of the variable Capflag. If the method determines that there is a compressed code in the dictionary 125 that matches the remaining characters in NL$ and that has the capitalization class that is equal to the capitalization class of the variable Capflag, then in step 1203, the method retrieves the compressed code from the dictionary 125. In step 1205 the method stores the retrieved compressed code in the compressed document 103. Upon completion of step 1205 the method OutputLast, in step 1207, returns processing control to the method OutputNonLetterCompressedCode (FIG. 5).

Returning to the discussion of step 1201 if the method determines that there is not a single compressed code in the dictionary 125 that matches the remaining characters in NL$, and that has a capitalization class that is equal to the capitalization class of the variable Capflag, then in step 1209, the method retrieves the compressed code from the dictionary 125 that matches the remaining characters in NL$. In step 1211 the method retrieves the compressed code from the dictionary 125 that represents the nil string and that has the capitalization class that is equal to the capitalization class stored in Capflag. Upon completion of step 1211 the method OutputLast, in step 1207, returns processing control to the method OutputNonLetterCompressedCode (FIG. 5).

FIG. 13 is a flow diagram of the method Query which retrieves information from the compressed document 149 stored in the remote computer memory 143 of the remote computer 115, based on a query request from the user of the remote computer 115. The method Query receives a query request, parses off a character string to search for, and converts the parsed character string into the compressed code of the present invention. The method Query then searches the compressed document 149 stored in the remote computer memory 143 for a match with the compressed code representing the character string parsed from the query request. If a match is found then the method Query sends relevant information to the initiator of the query request, else the method Query informs the initiator of the query request that no match was found. In the preferred embodiment the query engine 147 (FIG. 1) performs the steps of the method Query.

In step 1301 the method receives a query request input by the user of the remote computer 115 on either the remote computer keyboard 111 or the remote computer mouse 113. In step 1303 the method retrieves a character string upon which to search, from the query request. For example, if the query request asks whether any documents contain the word "ready", then the method retrieves the character string "ready" from the query request. In step 1305 the method Query calls the method Compress which converts the retrieved character string from the query request into the compressed code of the present invention. The method Compress is set forth in more detail above and is shown in FIG. 3.

Figure 15:
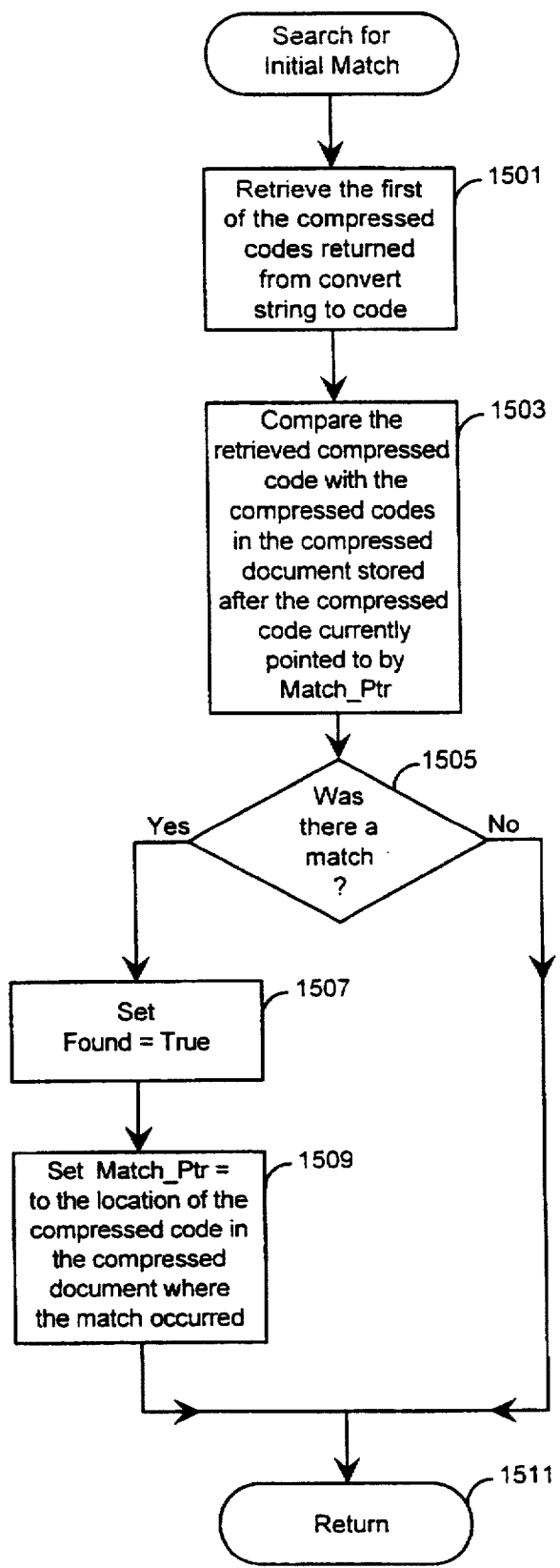
FIG. 15 is a flow diagram of a method SearchForInitialMatch used by the system of FIG. 1.

Upon completion of step 1305, the method Query calls the method SearchForMatch which searches the compressed document 149 stored in the remote computer 143 using the compressed code or compressed codes retrieved from the method Compress which is associated with the retrieved character string from the query request. The method SearchForMatch is set forth in more detail below and is shown in FIG. 15.

Upon completion of step 1307 the method Query performs step 1309 which determines whether a match was found between the compressed code (or compressed codes) associated with the retrieved character string from the query request and the compressed code (or compressed codes) in the compressed document 149. If a match was found then in step 1311 the method Query sends relevant information to the initiator of the query request (e.g., the user of the remote computer 115). In step 1313 the method Query ends processing related to the query request. However, data processing unrelated to the query request may continue in the remote computer 115.

Returning to the discussion of step 1309, if the method determines that a match was not found between the compressed code for the character string retrieved from the query request and one of the compressed codes in the compressed document 149, then in step 1315 the method Query informs the initiator of the query request that no match was found. Upon completion of step 1315 the method Query, in step 1313, ends processing related to the query request. However, data processing unrelated to the query request may continue in the remote computer 115.

FIG. 14 is a flow diagram of the method SearchForMatch which searches for a match between the compressed code (or compressed codes) associated with the character string retrieved from the query request and the compressed codes in the compressed document 149. If there is only one compressed code that represents the character string retrieved from the query request then the method SearchForMatch searches the compressed document 149 to find a match with one of the compressed codes stored in the compressed document 149. If a match is found then a boolean variable named Found is set to the value True.

If there is more than one compressed code that represents the character string retrieved from the query request then the method SearchForMatch must determine if the compressed codes representing the character string retrieved from the query request are (1) stored in the compressed document 149, (2) in the proper order and (3) in logically consecutive storage locations.

In order to ensure that all three conditions are met, the method SearchForMatch creates and maintains an indicator (e.g., a pointer) named Match-Ptr to indicate the current compressed code in the compressed document 149 being processed. The method SearchForMatch increments the location of MatchPointer and compares the compressed code pointed to by MatchPointer with the first compressed code representing the character string from the query request until a match is found. Then the method SearchForMatch increments MatchPointer until matches for all compressed codes from the query request are found or until one of the compressed codes from the query request does not match the compressed code pointed to by MatchPointer. In this way, the method SearchForMatch ensures that the character string from the query request is found if it exists in the document 145.

Without these three conditions, the method SearchForMatch could find matches for the compressed codes representing the character string from the query request as individual entries rather than as compressed codes that are logically grouped together. For example, assume that the method SearchForMatch searches within a document containing the sentence "a driver can enter an intersection to turn if the traffic signal is green", for the character string "turn signal", which is represented by compressed code for the word "turn" and a separate compressed code for the word "signal". Without the three conditions set forth above, there is a danger that the method SearchForMatch would mistake the compressed code for the individual word "turn" and the individual word "signal" as a match for the phrase "turn signal". In the preferred embodiment, the search program 159 of the query engine 147 performs the steps of the method SearchForMatch.

In step 1401 the method SearchForMatch retrieves the compressed code or codes returned from the method Compress which represent the character string retrieved from the query request. In step 1403, if the method determines that there is only one compressed code which represents the character string retrieved from the query request, then in step 1407 the method sets the boolean variable "found" equal to the value false. In step 1409 the method compares the retrieved compressed code with the compressed codes in the compressed document 149. In the preferred embodiment the comparison between the retrieved compressed code and the compressed codes in the compressed document 149 is performed using a 16 bit integer compare command, for example, the 16 bit integer compare command for the Intel x86 microprocessors. In step 1411, if the method determines that there was not a match between the retrieved compressed code and the compressed codes in the compressed document 149, then in step 1413 the method SearchForMatch returns processing control to the method Query (FIG. 13).

Returning to the discussion of step 1411, if the method determines that there was a match between the retrieved compressed code and the compressed codes in the compressed document 149, then the method in step 1415 sets the boolean variable "Found" equal to the value True. Upon completion of step 1415, the method SearchForMatch in step 1413 returns processing control to the method Query (FIG. 13).

Returning to the discussion of step 1405, if the method SearchForMatch determines that there is more than one compressed code returned from the method Compress which represents the character string retrieved from the query request, then in step 1417 the method sets an indicator (e.g., a pointer) called Match-Ptr equal to the first compressed code in the compressed document 149. In step 1419 the method sets the boolean variable "Found" equal to the value False. In step 1421 the method determines whether Match-Ptr points to the end of the file of the compressed document 149. If Match-Ptr does not point to the end of the file, then in step 1423 the method determines if all the compressed codes returned from the method Compress have been processed and whether the boolean variable "Found" equals True. If all the compressed codes returned from the method Compress have not been processed or if the boolean variable "Found" equals False, then the method continues processing at step 1425.

Figure 16:
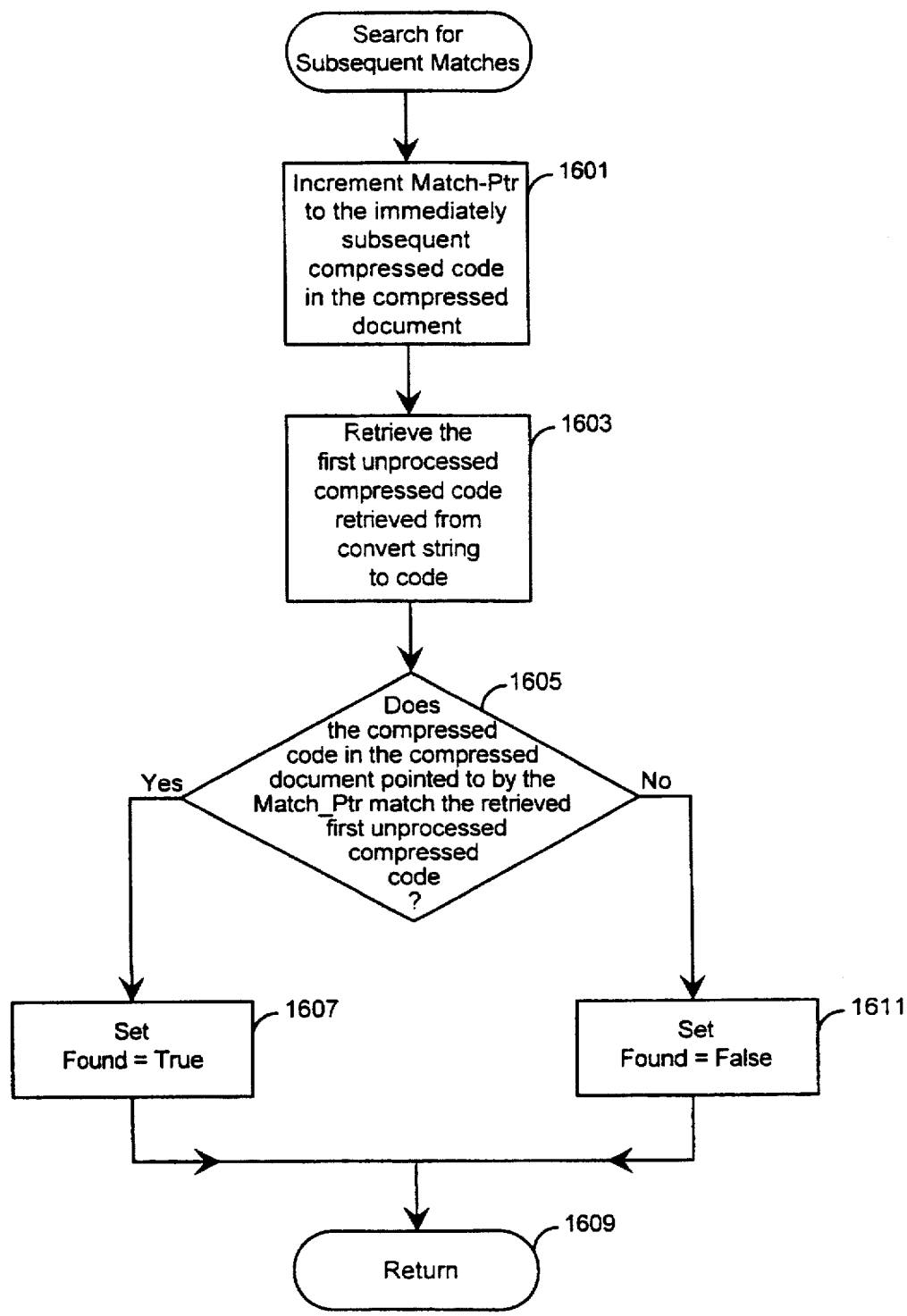
FIG. 16 is a flow diagram of a method SearchForSubsequentMatches used by the system of FIG. 1.

If in step 1425 the method determines that the boolean variable "Found" equals False, then in step 1427 the method SearchForMatch calls the method SearchForInitialMatch. The method SearchForInitialMatch retrieves the first of the compressed codes returned from the method Compress and determines if the retrieved compressed code is stored in the compressed document 149. The method SearchForInitialMatch is discussed in more detail below and is shown in FIG. 16. Upon completion of step 1427 the method SearchForMatch continues processing with step 1421.

Returning to the discussion of step 1425, if the method determines that the variable "Found" equals True, then in step 1429 the method SearchForMatch calls the method SearchForSubsequentMatches. The method SearchForSubsequentMatches determines whether the compressed codes stored in the compressed document 149 immediately after the compressed code located by the method SearchForInitialMatch are equal to the compressed codes returned from the method Compress which have not yet been processed. For example, if the query requested a search for the word "confirmation", then the call to the method SearchForSubsequentMatches ensures that the character string "nfirmation" is stored immediately after the initially matched string of letters "co". The method SearchForSubsequentMatches is discussed in more detail below and is shown in FIG. 16. Upon completion of step 1429, the method SearchForMatch continues processing with step 1421.

Returning to the discussion of step 1423, if the method determines that all the compressed codes returned from the method Compress have been processed and that the boolean variable "Found" equals True, then in step 1413 the method SearchForMatch returns processing control to the method Query (FIG. 13).

Returning to the discussion of step 1421, if the method determines that Match-Ptr points to the end of the file of the compressed document 149, then in step 1431 the method determines whether all the compressed codes returned from the method Compress have been processed. If Match-Ptr points to the end of the file of the compressed document 149 and all the compressed codes returned from the method Compress have not been processed, then in step 1433 the method sets the variable "Found" equal to False. In this way, the method properly processes the case where a subset of the character string searched for is the last character string stored in the compressed document 149. For example, if the query requested a search for the word "confirmation" and the last word stored in the compressed document 149 was the word "confirm", then steps 1421, 1431, and 1433 ensure that the boolean variable "Found" is set to False, indicating that the word "confirmation" was not found in the compressed document 149. Upon completion of step 1433 the method SearchForMatch, in step 1413, returns processing control to the method Query (FIG. 13).

Returning to the discussion of step 1431, if the method determines that Match-Ptr points to the end of the file of the compressed document 149 and that all the compressed codes return from the method Compress have been processed then in step 1413, the method SearchForMatch returns processing control to the method Query (FIG. 13).

FIG. 15 is a flow diagram of the method SearchForInitialMatch which retrieves the first of the compressed codes returned from the method Compress and which determines whether the retrieved compressed code is stored in the compressed document 149. When the method SearchForInitialMatch begins processing, the method Compress (FIG. 3) has already been invoked by the method Query and has converted a character string parsed from the query request into a single compressed code or into multiple compressed codes. The method SearchForInitialMatch also compares the single compressed code or the multiple compressed code for the character string parsed from the query request with the compressed codes stored in the compressed document 149. If a match is found then an indicator named Match-Ptr is set equal to the location where the match occurred. In the preferred embodiment, the method SearchForInitialMatch is performed by the search program 159 of the query engine 147.

In step 1501, the method SearchForInitialMatch retrieves the first of the compressed codes returned from the method Compress. In step 1503 the method compares the retrieved compressed code with the compressed codes in the compressed document 149 which are stored after the compressed code currently pointed to by Match-Ptr. In step 1505, if the method determines that there was a match between the retrieved compressed code and the compressed codes in the compressed document 149 stored after the compressed code currently pointed to by Match-Ptr then in step 1507 the method sets the boolean variable "Found" equal to True. In step 1509 the method sets Match-Ptr equal to the location of the compressed code in the compressed document 149 where the match occurred. In this way the method keeps track of which character strings in the compressed document 149 remain unprocessed. In step 1511 the method SearchForInitialMatch returns processing control to the method SearchForMatch (FIG. 14).

Returning to the discussion of step 1505, if the method determines that there was not a match between the retrieved compressed code and the compressed codes in the compressed document 149 stored after the compressed code currently pointed to by Match-Ptr, then in step 1511 the method SearchForInitialMatch returns processing control to the method SearchForMatch (FIG. 14).

FIG. 16 is a flow diagram of the method SearchForSubsequentMatches. The method SearchForSubsequentMatches determines whether the compressed codes stored in the compressed document 149 immediately after the compressed code located by the method SearchForInitialMatch are equal to the compressed codes returned from the method Compress which have not yet been processed.

In step 1601 the method increments the Match-Ptr to point to the compressed code which is stored immediately after the compressed code currently pointed to by Match-Ptr. In step 1603 the method retrieves the first unprocessed compressed code returned from the method Compress. In step 1605, if the method determines that the compressed code in the compressed document 149 pointed to by the Match-Ptr matches the retrieved first unprocessed compressed code then in step 1607 the method sets the boolean variable "Found" equal to True. In step 1609 the method SearchForSubsequentMatches returns processing control to the method SearchForMatch (FIG. 14).

Returning to the discussion of step 1605, if the method determines that the compressed code in the compressed document pointed to by the Match-Ptr does not match the retrieved first unprocessed compressed code, then the method sets the boolean variable "Found" equal to False in step 1611. Upon completion of step 1611 the method, in step 1609, returns processing control to the method SearchForMatch (FIG. 14).

Specific Example For The Embodiment Using Fixed Length Compressed Codes

Figure 17:
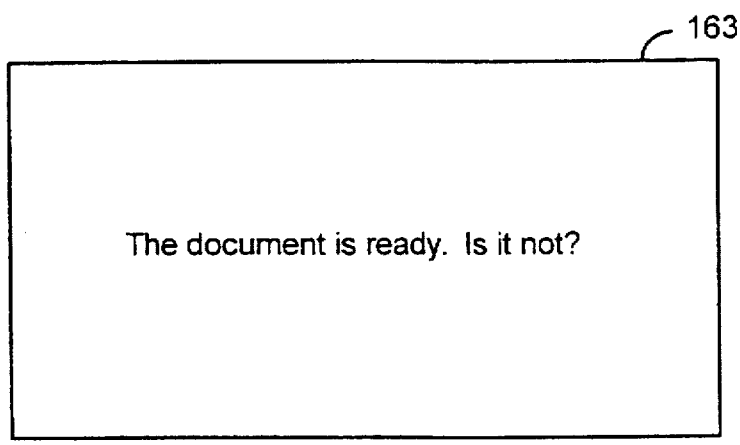
FIG. 17 is a block diagram of a sample document.

A specific example using FIGS. 17–25 will help illustrate the preferred method and system for searching fixed length compressed data. Typically, a user of the remote computer 115 (FIG. 1) inputs a request to transfer the uncompressed document 101 from the host computer 109 to the remote computer 115. FIG. 17 shows the uncompressed document 101 displayed on a host computer display device 163. FIG. 18 shows the uncompressed document 101 as it is stored in the host computer memory 123.

In response to the transfer request, the host computer 109 invokes the compression engine 129 which converts the uncompressed document 101 to the compressed document 103 containing fixed length compressed codes. To convert the uncompressed document 101 into the compressed document 103, the compression engine 129 invokes the parser 127 which parses uncompressed character strings stored in the uncompressed document 101 and sends the parsed character strings back to the compression engine 129.

The compression engine 129 receives from the parser 127 the parsed character string in its uncompressed code. Then the compression engine 129 finds a match for the uncompressed code in the dictionary 125 and retrieves from the dictionary 125 a fixed length compressed code associated with the matched uncompressed code. Finally, the compression engine 129 stores the retrieved fixed length compressed code from the dictionary 125 in the compressed document 103.

After every character string from the uncompressed document 101 has been converted to the fixed length compressed code of the present invention and stored in the compressed document 103, the host computer 109 transfers the compressed document 103 from the host computer 109, over the communications channel 117, to the remote computer 115 where it is stored as the compressed document 149. FIG. 19 shows the compressed document 149 as it is stored in the remote computer memory 143.

Figure 20:
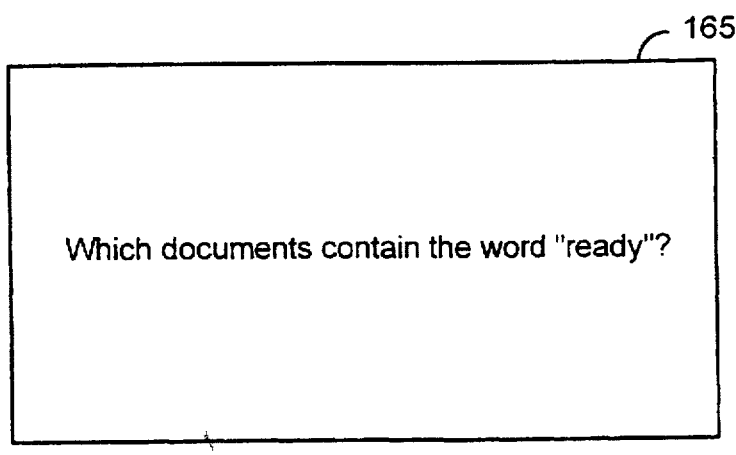
FIG. 20 is a block diagram of a query request displayed on a display device for the system of FIG. 1.
Figure 21:
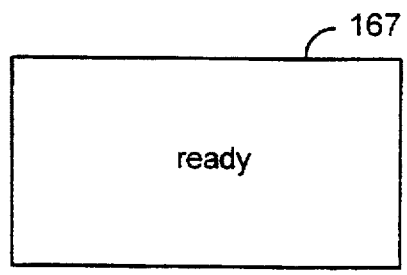
FIG. 21 is a block diagram of the character string parsed from the query request.

A user of the remote computer 115 typically inputs a query in order to retrieve information about the compressed document 149. FIG. 20 illustrates a typical query request 165 which was entered on the remote computer keyboard 111 and later stored in the remote computer memory 143. The query request 165 asks "What documents contain the word 'ready'?" In response to receiving the query request 165, the remote computer 115 invokes the query engine 147. The query engine 147 retrieves the word to search for from the query request 165, in this case the query engine 147 retrieves the word "ready" 167 from the query request 165 (see FIG. 21).

Next, the query engine 147 invokes the convert program 161 which converts the word "ready" to the fixed length compressed code of the present invention. The convert program 161 searches the dictionary 145 (FIG. 2) to see if there is a match with the word "ready". When the convert program 161 determines that the dictionary 145 does not contain the word "ready" it searches the dictionary 145 for the first two characters from the word "ready", i.e., the character string "re". When the convert program 161 determines that the character string "re" is stored in the pairs section 153 of the dictionary 145, it retrieves the compressed code 0111 0110 1101 0110 associated with the character string "re". The convert program 161 then stores the retrieved compressed code 169 in the remote computer memory 143 (see FIG. 22).

Next, the convert program 161 removes the first two unprocessed characters from the word "ready", i.e., the character string "ad". When the convert program 161 determines that the character string "ad" is stored in the pairs section 153 of the dictionary 145, it returns the compressed code 0111 0101 0011 1110 associated with the character string "ad". The convert program 161 then stores the retrieved compressed code in the remote computer memory 143 (see FIG. 22).

Finally, the convert program 161 determines that only one unprocessed character remains from the word "ready", i.e., the character "y". The convert program 161 retrieves the compressed code 1111 1111 1111 0100 associated with the character "y" stored in the ASCII section 155 of the dictionary 145. The convert program 161 then stores the retrieved compressed code in the remote computer memory 143 (see FIG. 22).

Figure 22:
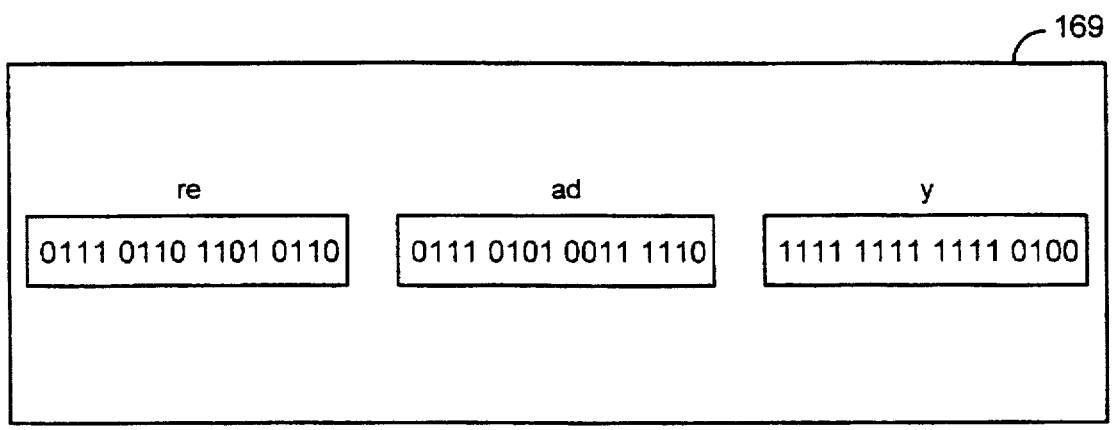
FIG. 22 is a block diagram of fixed length compressed codes representing the character string from the query request.
Figure 23:
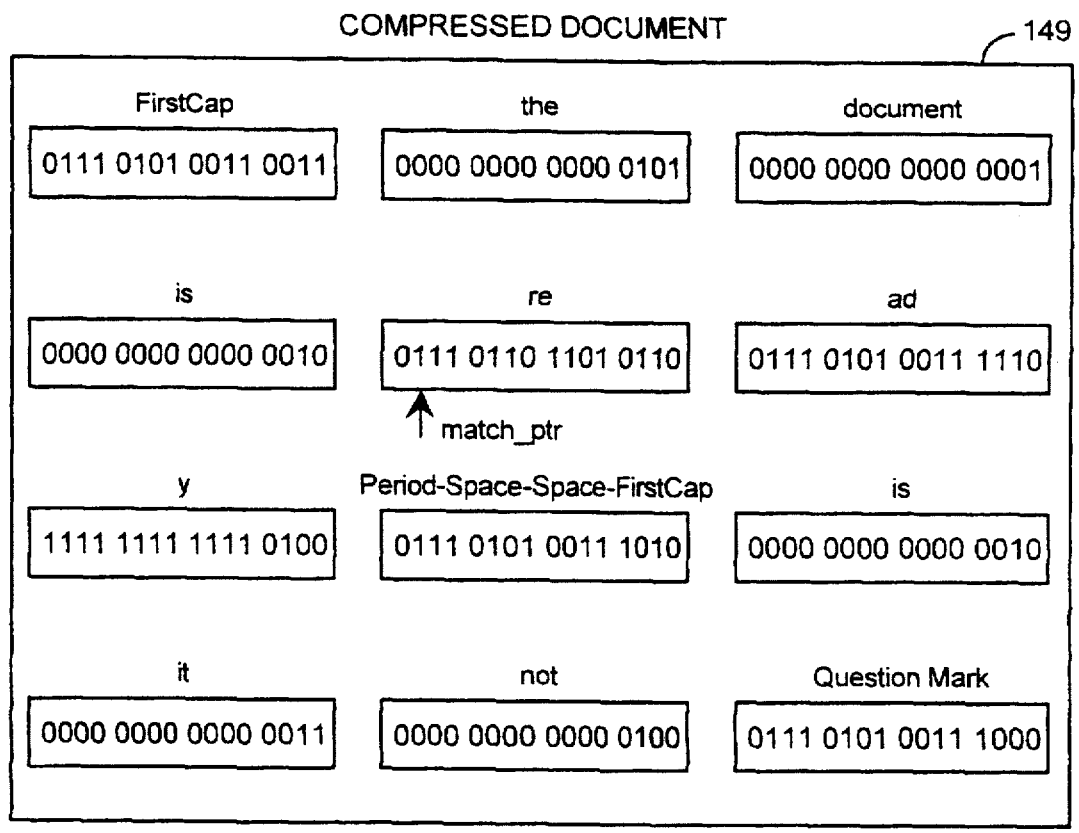
FIGS. 23, 24, and 25 are block diagrams illustrating searching for the query request in the fixed length compressed code.
Figure 24:
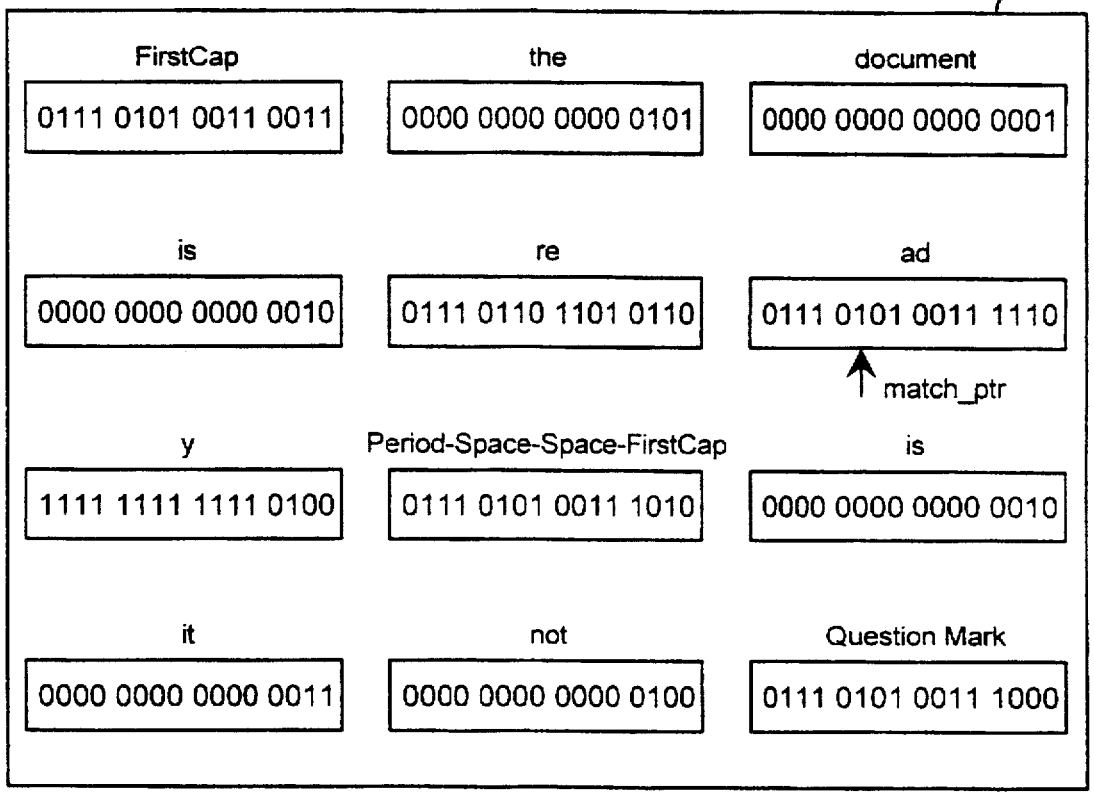
Figure 25:
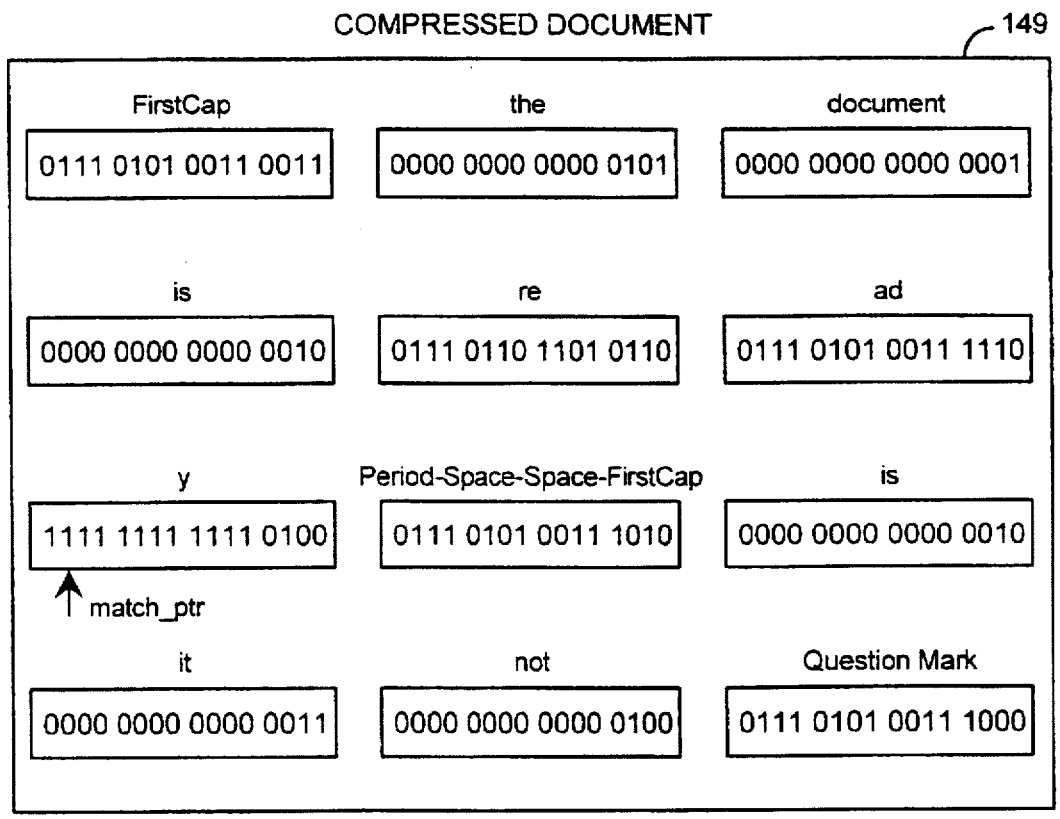

Upon completion of the conversion of the word "ready" to the fixed length compressed code of the present invention, the query engine 147 invokes the search program 159 which searches the compressed document 149 for occurrences of compressed codes representing the word "ready". The search program 159 first retrieves the compressed code for the character string "re" (FIG. 22). The search program 159 then sets an indicator named Match-Ptr to the first fixed length compressed code in the compressed document 149. The search program 159 compares the fixed length compressed code pointed to by Match-Ptr with the fixed length compressed code for the character string "re". As FIG. 23 indicates, the first compressed code in the document 149 does not match the compressed code for the character string "re". Therefore, the search program 159 continues to increment Match-Ptr and compare fixed length compressed codes until a match is found. FIG. 23 illustrates the position of Match-Ptr within the compressed document 149 when a match with the compressed code for the character string "re" occurs.

The search program 159 next increments Match-Ptr and compares the fixed length compressed code in the compressed document 149 pointed to by Match-Ptr (see FIG. 24) with the fixed length compressed code for the character string "ad" (see FIG. 22). Because a match occurs, the search program 159 increments Match-Ptr and compares the fixed length compressed code in the compressed document 149 pointed to by Match-Ptr (see FIG. 24) with the fixed length compressed code for the character string "y" (see FIG. 22). Because a match occurs, the query engine 147 informs the initiator of the request that the compressed document 149 contains the word "ready".

Figure 26:
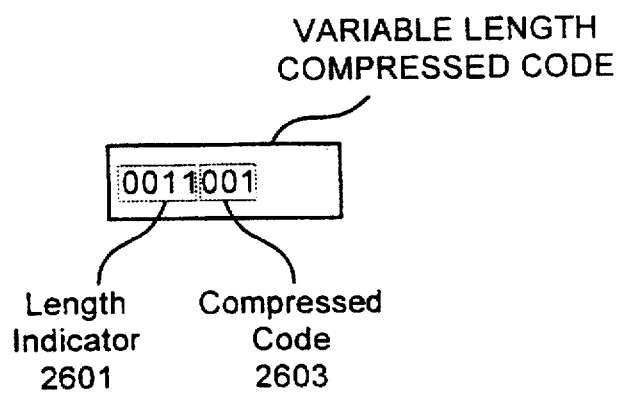
FIG. 26 is a block diagram of a variable length compressed code for the system of FIG. 1.

An alternative embodiment of the present invention converts character strings in an uncompressed document 101 from an uncompressed code to a variable length compressed code, stores the character strings in their variable length compressed code in a compressed document 103', and searches for character strings in the compressed document 103' while the character strings remain in their variable length compressed code. FIG. 26 shows the preferred variable length compressed code of the present invention which includes a length indicator 2601 and a compressed code 2603. The length indicator 2601 indicates the number of bits in the compressed code 2603. For example, the length indicator 2601 shown in FIG. 26 contains a binary number equivalent to the decimal value three, indicating that the compressed code 2603 illustrated in FIG. 26 is three bits in length.

Specific Example For Embodiment Using Variable Length Compressed Codes

A specific example using FIGS. 17–18, 20–21, and 26–33 will help illustrate the preferred method and system for searching variable length compressed codes of the compressed document 103'. Typically, a user of the remote computer 115 inputs a request to transfer the uncompressed document 101 from the host computer 109 to the remote computer 115. FIG. 17 shows the uncompressed document 101 displayed on the host computer display device 163. FIG. 18 shows the uncompressed document 101 as it is stored in the host computer memory 123.

In response to the transfer request, the host computer 109 invokes the compression engine 129 which converts the uncompressed document 101 to the compressed document 103' containing variable length compressed codes. To convert the uncompressed document 101 into the compressed document 103', the compression engine 129 invokes the parser 127 which parses uncompressed character strings stored in the uncompressed document 101 and sends the parsed character strings back to the compression engine 129.

The compression engine 129 receives from the parser 127 the parsed character string in its uncompressed code. Then the compression engine 129 finds a match for the uncompressed code in the dictionary 125' (FIG. 27A) which is comprised of word section 131', punctuation and formatting section 137', pairs sections 133', and/or ASCII 135' and retrieves from the dictionary 125' a variable length compressed code associated with the matched uncompressed code. Finally, the compression engine 129 stores the retrieved variable length compressed code from the dictionary 125' in the compressed document 103'.

Figure 28:
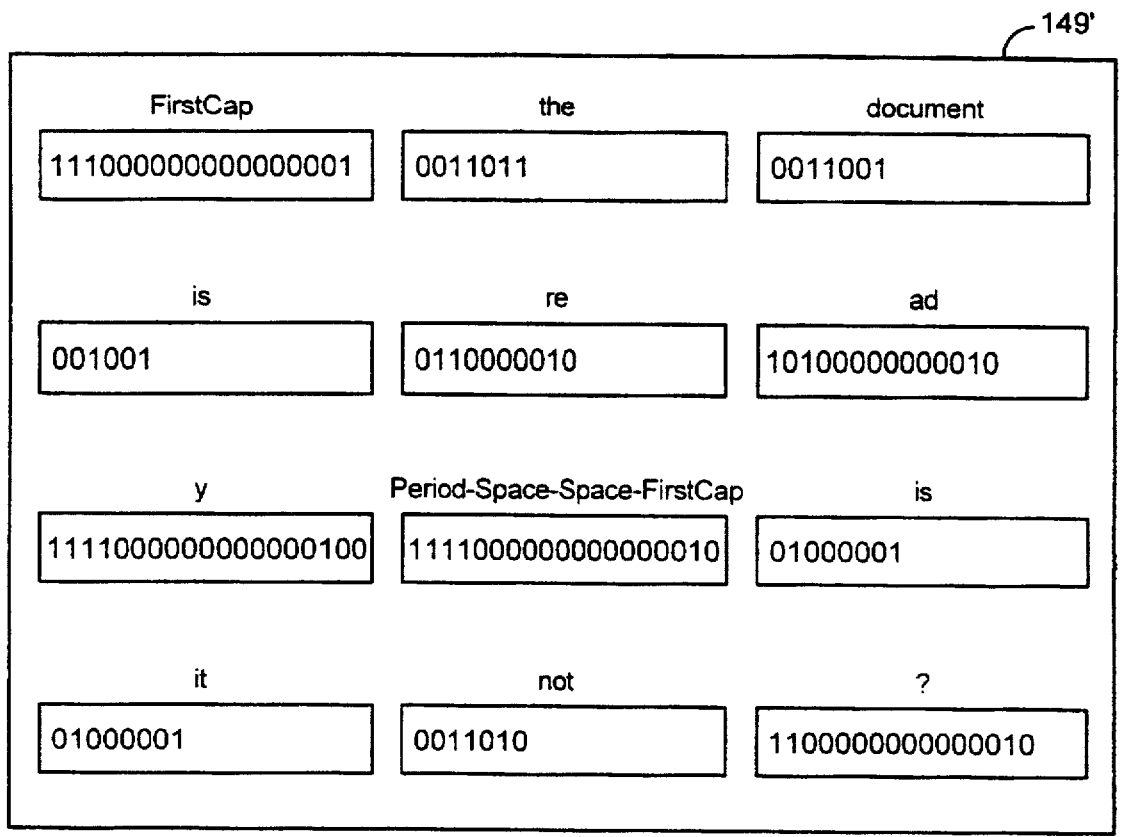
FIG. 28 is a block diagram of a compressed document of the variable length compressed codes as it is stored in the memory of the system of FIG. 1.

After every character string from the uncompressed document 101 has been converted to the variable length compressed code of the present invention and stored in the compressed document 103', the host computer 109 transfers the compressed document 103' from the host computer 109, over the communications channel 117, to the remote computer 115 where it is stored as the compressed document 149'. FIG. 28 shows the compressed document 149' as it is stored in the remote computer memory 143.

A user of the remote computer 115 typically inputs a query in order to retrieve information about the compressed document 149'. FIG. 20 illustrates a typical query request 165 which was entered on the remote computer keyboard 111 and later stored in the remote computer memory 143. The query request 165 asks "what documents contain the word 'ready'?" In response to receiving the query request 165, the remote computer 115 invokes the query engine 147. The query engine 147 retrieves the word to search for from the query request 165; in this case the query engine 147 retrieves the word "ready" from the query request 165 (see FIG. 21).

Next, the query engine 147 invokes the convert program 161 which converts the word "ready" to the variable length compressed code of the present invention. The convert program 161 searches the dictionary 145' which has word section 151', punctuation and formatting section 157', pairs section 153', and ASCII section 155', to see if there is a match with the word "ready". When the convert program 161 determines that the dictionary 145' does not contain the word "ready", it searches the dictionary 145' for the first two characters from the word "ready", i.e., the character string "re". When the convert program 161 determines that the character string "re" is stored in the pairs section 153' of the dictionary 145', it retrieves the compressed code 0110000010 associated with the character string "re". The convert program 161 then stores the retrieved compressed code in the remote computer memory 143 (see FIG. 29).

Next, the convert program 161 removes the first two unprocessed characters from the word "ready", i.e., the character string "ad". When the convert program 161 determines that the character string "ad" is stored in the pairs section 153' of the dictionary 145', it returns the compressed code 10100000000010 associated with the character string "ad". The convert program 161 then stores the retrieved compressed code in the remote computer memory 143 (see FIG. 29).

Finally, the convert program 161 determines that only one unprocessed character remains from the word "ready", i.e., the character "y". The convert program 161 retrieves the compressed code 1111000000000000100 stored in the ASCII section 155' of the dictionary 145'. The convert program 161 then stores the retrieved compressed code 169' in the remote computer memory 143 (see FIG. 29).

Figure 29:
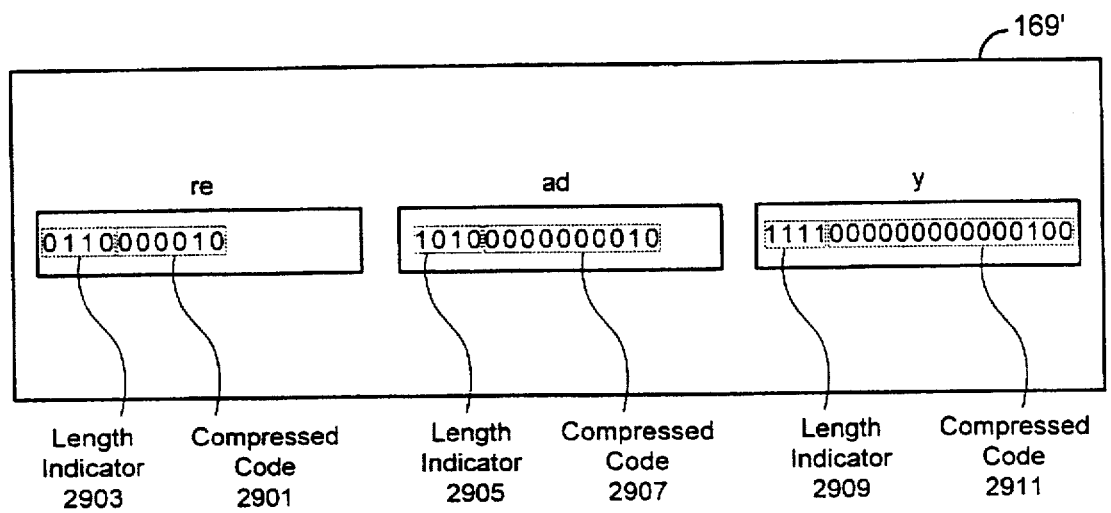
FIG. 29 is a block diagram of variable length compressed codes representing the character string from the query request.
Figure 30:
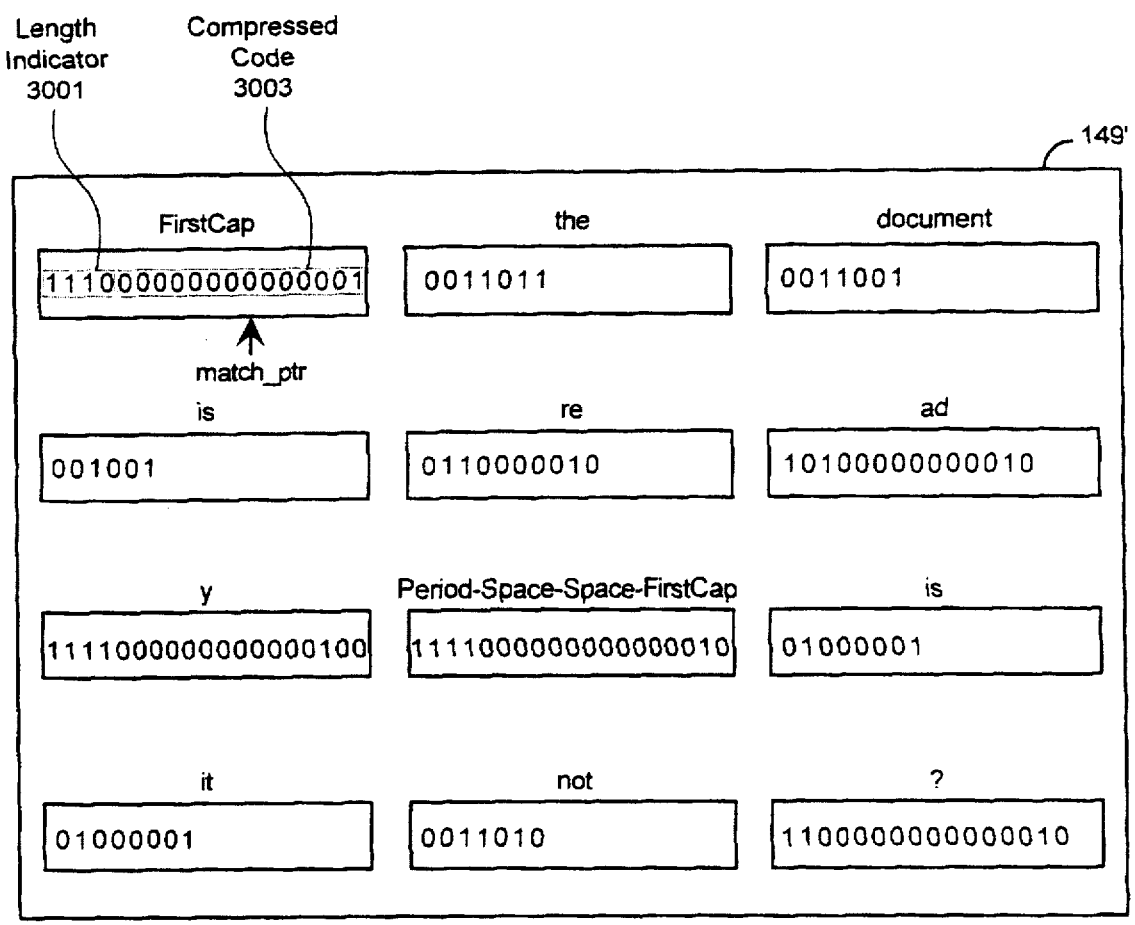
FIGS. 30, 31, 32, and 33 are block diagrams illustrating searching for the query request in the variable length compressed code.

Upon completion of the conversion of the word "ready" to the variable length compressed code of the present invention, the query engine 147 invokes the search program 159 which searches the compressed document 149' for occurrences of compressed codes representing the word "ready". The search program 159 first retrieves the compressed code for the character string "re" (FIG. 29). Then the search program 159 determines the length of the compressed code 2901 for the character string "re", from the value of the length indicator 2903 for the character string "re". In this case the length indicator 2903 indicates that the compressed code 2901 is 6-bits in length. The search program 159 then sets an indicator named Match-ptr to the first variable length compressed code in the compressed document 149' (see FIG. 30).

Figure 31:
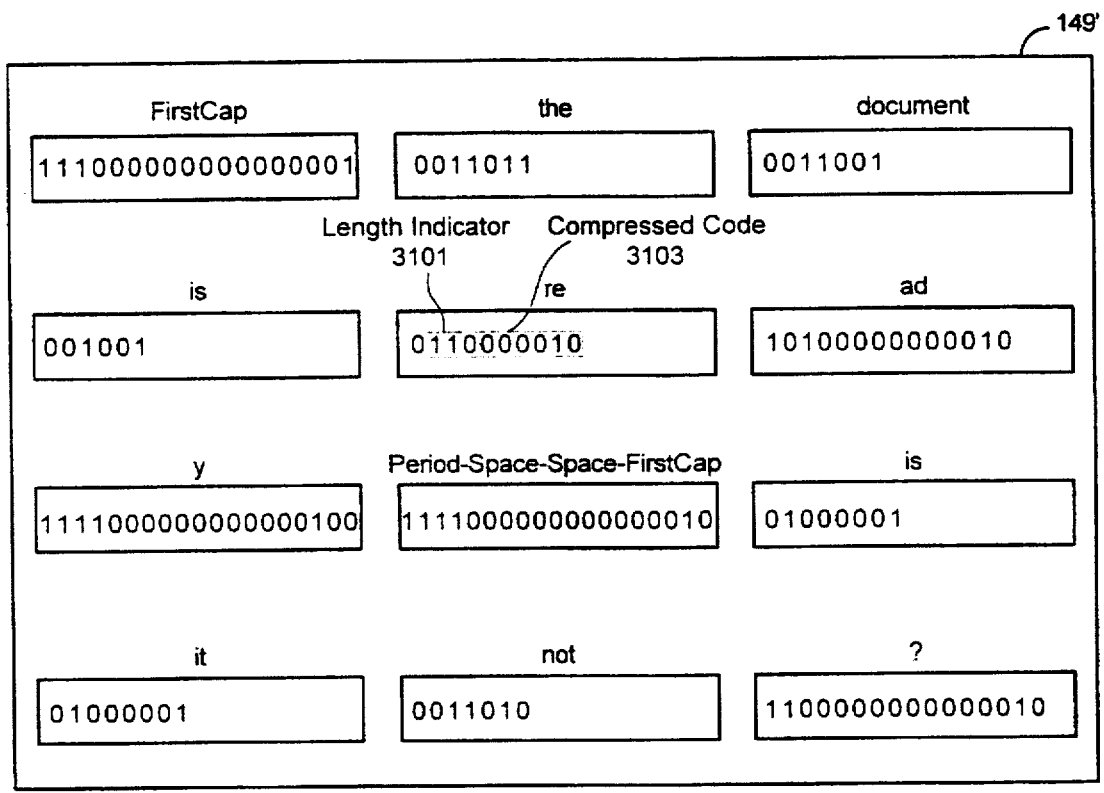
Figure 32:
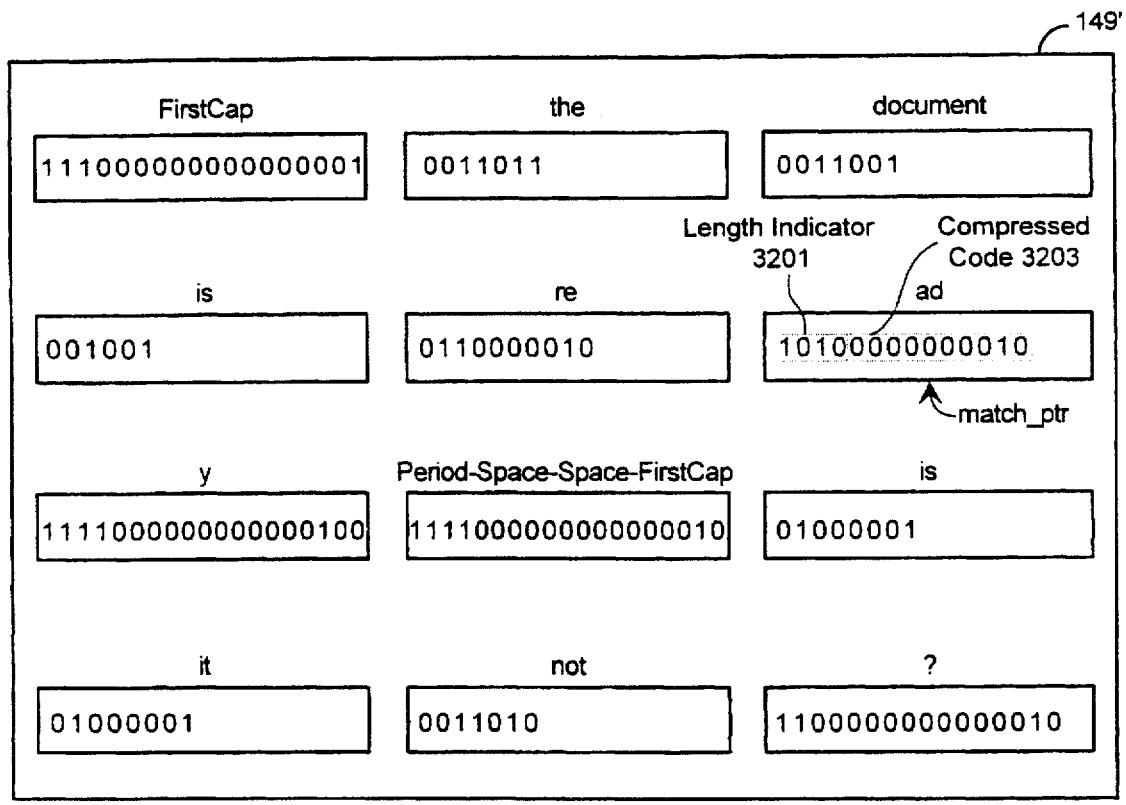

By determining the length of the compressed code 2901, the search program 159 need only compare the compressed code 2901 against compressed codes in the compressed document 149' with identical lengths. The search program 159 then compares the value of the length indicator 3001 for the character string "Firstcap" with the value of the length indicator 2903 for the character string "re". Because the value of the length indicator 2903 is equal to six and the value of the length indicator 3001 is equal to twelve, the search program 159 determines that the compressed code 2901 is not a match for the compressed code 3003. Therefore, the search program 159 increments Match-ptr and compares the length indicator 2903 of the character string "re" with the length indicators of the character strings pointed to by Match-ptr, until a match is found. FIG. 31 illustrates the position of Match-ptr within the compressed document 149' when a match with the length indicator 2903 for the character string "re" occurs.

The search program 159 then compares the compressed code 2901 for the character string "re" with the compressed code 3103 for the character string pointed to by Match-ptr, and determines that a match is found.

Now that a match for character string "re" has been found, the search program 159 proceeds to determine if the next two variable length compressed codes stored in the compressed document 149' match the character string "ad" and the character string "y", respectively. The search program 159 increments Match-ptr and compares the length indicator 2905 (FIG. 29) for the character string "ad" with the length indicator 3201 (FIG. 32) for the character string pointed to by Match-ptr. Because the value of the length indicator 2905 equals the value of the length indicator 3201, the search program 159 compares the compressed code 2907 of the character string "ad" with the compressed code 3203 for the character string pointed to by Match-ptr.

Figure 33:
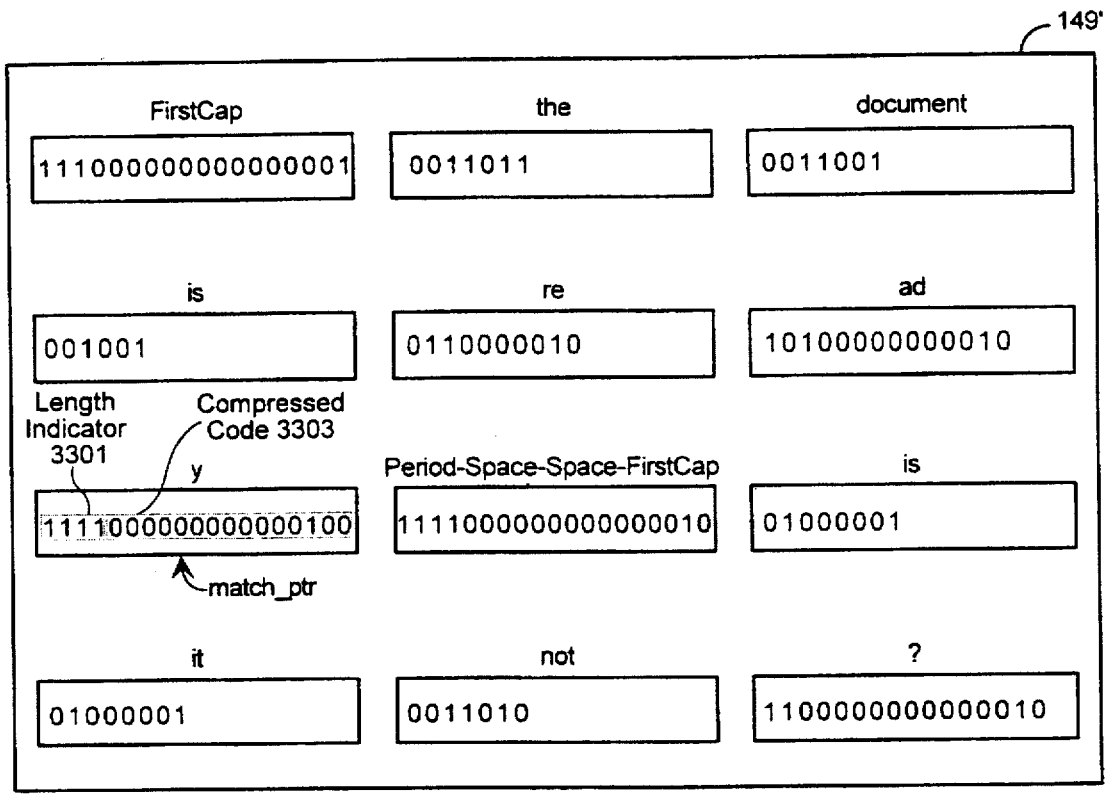

Because a match occurs between the compressed codes, the search program 159 increments Match-ptr and compares the length indicator 2909 of the character string "y" with the length indicator 3301 for the character string pointed to by Match-ptr (FIG. 33). Because the value of the length indicator 2909 for the character string "y" equals the value of the length indicator 3301 for the character string pointed to by Match-ptr, the search program 159 compares the compressed code 2911 for the character string "y" with the compressed code 3303 for the character string pointed to by Match-ptr. Because a match occurs, the query engine 147 informs the initiator of the request that the compressed document 149' contains the word "ready".

Those of ordinary skill in the art will understand that other system architectures can be used to implement the methods of the present invention described above, including, but not limited to, a stand alone computer which compresses an uncompressed document and which performs a search on the compressed document.

A typical commercial use for this invention is to download news stored into a handheld computer running on an inexpensive 8086 based processor. By using the Intel integer Compare command of the 8086 processor, each comparison between the 16-bit query request and one of the 16-bit compressed codes in the compressed document 149 can be performed in one instruction (3 clock ticks). Thus, large amounts of data can be quickly searched for on an inexpensive device. Those of ordinary skill in the art will understand that other chip architecture may use a different length of compressed codes in order to optimize search speed.

Those of ordinary skill in the art will also understand that the method and apparatus of the present invention can be used in conjunction with other compression methods. For example, character strings in a uncompressed document could be converted into the 16-bit compressed code of the present invention and then further converted into a variable length code (e.g., a Huffman code) before transmission to a remote computer where the character strings are converted back into the 16-bit compressed code of the present invention and processed in the manner set forth above.

It will be appreciated that, although a specific embodiment of the invention has been described herein for purposes of illustration, various modifications may be made without departing from the spirit and scope of the invention. Accordingly, the invention is not limited except as by the appended claims.

I claim:

1. An apparatus for searching a compressed document comprised of a plurality of variable length compressed codes which represent an uncompressed document, each variable length compressed code having a length indicator which indicates the length of the variable length compressed code, the apparatus comprising:

means for receiving a query request in an uncompressed code;

means for converting the query request from the uncompressed code into a converted query request of one of the plurality of variable length compressed codes;

means for determining the length of the converted query request;

means for comparing the converted query request with the variable length compressed codes of the compressed document, to determine if variable length compressed codes of the compressed document match the converted query request, wherein the converted query request is only compared with those variable length compressed codes whose length is equal to the length of the converted query request, and means for responding to the determination that there is a match between the variable length compressed codes of the compressed document and the converted query request.

2. A method for searching a compressed document comprised of a plurality of variable length compressed codes which represent an uncompressed document, each variable length compressed code having a length indicator which indicates the length of the variable length compressed code, the method comprising the steps of:

receiving a query request in an uncompressed code;

converting the query request from the uncompressed code into a converted query request of one of the plurality of variable length compressed codes;

means for determining the length of the converted query request;

comparing the converted query request with the variable length compressed codes of the compressed document, to determine which variable length compressed codes of the compressed document match the converted query request, wherein the converted query request is only compared with those variable length compressed codes whose length is equal to the length of the converted query request; and responding to the determination that there is a match between the variable length compressed codes of the compressed document and the converted query request.

3. A computer-readable memory device for controlling a computer system to perform the steps of claim 2.

4. An apparatus for searching a compressed document comprised of a plurality of fixed length compressed codes which represent an uncompressed document, the apparatus comprising:

means for receiving a query request in a uncompressed code;

means for converting the query request from the uncompressed code into a converted query request of the fixed length compressed code;

means for comparing the converted query request with the fixed length compressed codes of the compressed document to determine which fixed length compressed codes of the compressed document match the converted query request; and means for responding to the determination that there is a match between the fixed length compressed codes of the compressed document and the converted query request.

5. The apparatus of claim 4 wherein the plurality of character strings stored in the compressed document include character strings of letters with capitalization classes, the capitalization classes including an all caps capitalization class wherein each letter of the character string is a capital letter, a first cap capitalization class wherein only the first letter of the character string is capitalized, and a no caps capitalization class wherein all of the letters of the character string are lower case letters, and wherein the converting means includes, parsing means for retrieving from the query request a set of non-letter characters until a letter character is encountered, and a set of letter characters while the retrieved letter characters belong to one of the capitalization classes, first means for converting the retrieved set of non-characters into the fixed length compressed code, and second means for converting the retrieved set of letters into the fixed length compressed code which includes a representation of the capitalization class of the retrieved set of letters.

6. The apparatus of claim 4 wherein the converting means further comprises a dictionary for storing codes that represent character strings wherein the fixed length compressed code of the converted query request is retrieved from the dictionary, the dictionary including, a word section which stores a plurality of uncompressed codes and associated fixed length compressed codes, with each uncompressed code and associated compressed code representing a word, a pairs section which stores a variety of uncompressed codes and associated fixed length compressed codes, with each uncompressed code and associated compressed code representing a pair of letters, a formatting and punctuation section which stores a plurality of uncompressed codes and associated fixed length compressed codes, with each uncompressed code and associated fixed length compressed code representing one of a punctuation character and a formatting pattern, and an ASCII section which stores a plurality of uncompressed codes and associated fixed length compressed codes, with each uncompressed code and associated fixed length compressed code representing an ASCII character.

7. The apparatus of claim 4 wherein the converting means converts the query request into a single fixed length compressed code so that the comparing means can end comparing after the converted query request matches one of the fixed length compressed codes stored in the compressed document.

8. An apparatus for retrieving data, the apparatus comprising:

a compressed document including a plurality of character strings, each character string being stored in a compressed code;

means for receiving a query request; and means for searching for the query request in the compressed document while the plurality of character strings stored in the compressed document are stored in the compressed code.

9. An apparatus for searching a compressed document comprised of a plurality of variable length compressed codes which represent an uncompressed document, the apparatus comprising:

means for receiving a query request in an uncompressed code;

means for converting the query from the uncompressed code into a converted query request of the variable length compressed code;

means for comparing the converted query request with the variable length compressed codes of the compressed document, to determine if variable length compressed codes of the compressed document match the converted query request; and means for responding to the determination that there is a match between the variable length compressed codes of the compressed document and the converted query request.

10. The apparatus of claim 9 wherein each variable length compressed code includes a length indicator which indicates the length of the variable length compressed code.

11. The apparatus of claim 9 further including means for determining the length of the converted query request.

12. The apparatus of claim 11 wherein the comparing means only compares the converted query request with those variable length compressed codes whose determined length is equal to the length of the converted query request.

13. A method for searching a compressed document while a plurality of character strings stored in the compressed document are stored in a fixed length compressed code, the method comprising:

receiving a query request in a uncompressed code, wherein the uncompressed code represents the query request using a plurality of bits;

converting the query request from the uncompressed code into a converted query request of the fixed length compressed code;

comparing the converted query request with the plurality of fixed length compressed codes stored in the compressed document to determine which fixed length compressed codes from the compressed document match the converted query request; and responding to the determination that there is a match between the fixed length compressed codes of the compressed document and the converted query request.

14. The method of claim 13 wherein the plurality of character strings stored in the compressed document include character strings of letters with capitalization classes, the capitalization classes including an all caps capitalization class wherein each letter of the character string is a capital letter, a first cap capitalization class wherein only the first letter of the character string is capitalized, and a no caps capitalization class wherein all of the letters of the character string are lower case letters, and wherein the converting includes, retrieving from the query request a set of non-letter characters until a letter character is encountered, retrieving a set of letter characters while the retrieved letter characters belong to one of the capitalization classes, converting the retrieved set of non-characters into the fixed length compressed code, and converting the retrieved set of letters into the fixed length compressed code which includes a representation of the capitalization class of the retrieved set of letters.

15. The method of claim 13 wherein the converting converts the query request into a single fixed length compressed code so that the step of comparing stops comparing the converted query request with the plurality of fixed length compressed codes after the converted query request matches one of the plurality of fixed length compressed codes stored in the compressed document.

16. A method for retrieving data, the method comprising:

providing a compressed document including a plurality of character strings stored in a fixed length compressed code;

providing a query request in a fixed length compressed code; and searching for the query request in the compressed document while the plurality of character strings stored in the compressed document are stored in the fixed length compressed code.

17. A method for searching a compressed document comprised of a plurality of variable length compressed codes which represent an uncompressed document, the method comprising:

receiving a query request in an uncompressed code;

converting the query from the uncompressed code into a converted query request of the variable length compressed code;

comparing the converted query request with the variable length compressed codes of the compressed document, to determine which variable length compressed codes of the compressed document match the converted query request; and responding to the determination that there is a match between the variable length compressed codes of the compressed document and the converted query request.

18. The method of claim 17 wherein each variable length compressed code includes a size code which indicates the length of the variable length compressed code.

19. The method of claim 17 further including determining the length of the converted query request.

20. The method of claim 17 wherein comparing only compares the converted query request with those variable length compressed codes whose determined length is equal to the length of the converted query request.

21. A computer-readable medium containing instructions for causing a computer system to retrieve data by:
providing a compressed document including a plurality of character strings represented in a compressed form;
receiving a query request to locate a character string within the compressed document;
converting the character string to a compressed form; and
searching for an occurrence of the character string in compressed form in the compressed document whereby the compressed document is searched without decompressing the character strings of the document.

22. A computer-readable medium containing instructions for causing a computer system to search a compressed document comprised of a plurality of variable length compressed codes which represent an uncompressed document by:

receiving a query request in an uncompressed code;
converting the query request from the uncompressed code into a converted query request of the variable length compressed code;
comparing the converted query request with the variable length compressed codes of the compressed document to determine which variable length compressed codes of the compressed document match the converted query request; and
responding to the determination that there is a match between the variable length compressed codes of the compressed document and the converted query request whereby the compressed document can be queried without decompressing the document.

23. The computer-readable medium of claim 22 wherein each variable length compressed code includes a size code which indicates the length of the variable length compressed code.

24. The computer-readable medium of claim 22 further including determining the length of the converted query request.

25. The computer-readable medium of claim 22 wherein comparing only compares the converted query request with those variable length compressed codes whose determined length is equal to the length of the converted query request.

* * * * *